(12) United States Patent
Koga et al.

(10) Patent No.: US 9,619,087 B2
(45) Date of Patent: Apr. 11, 2017

(54) DISPLAY DEVICE AND ELECTRONIC APPARATUS

(71) Applicant: Japan Display Inc., Tokyo (JP)

(72) Inventors: Masayuki Koga, Tokyo (JP); Yukiya Hirabayashi, Tokyo (JP); Takahiro Ochiai, Tokyo (JP)

(73) Assignee: Japan Display Inc., Tokyo (JP)

( * ) Notice: Subject to any disclaimer, the term of this patent is extended or adjusted under 35 U.S.C. 154(b) by 271 days.

(21) Appl. No.: 14/201,128

(22) Filed: Mar. 7, 2014

(65) Prior Publication Data

US 2014/0267156 A1 Sep. 18, 2014

(30) Foreign Application Priority Data

Mar. 18, 2013 (JP) ................................. 2013-055243

(51) Int. Cl.
*G06F 3/044* (2006.01)
*G06F 3/041* (2006.01)

(52) U.S. Cl.
CPC ............ *G06F 3/044* (2013.01); *G06F 3/0416* (2013.01)

(58) Field of Classification Search
CPC ........ G06F 3/041; G06F 3/044; G06F 3/0416; G09G 5/00; G09G 3/36; G09G 3/3677; G11C 19/28
USPC ................................. 345/100, 173–174, 197
See application file for complete search history.

(56) References Cited

U.S. PATENT DOCUMENTS

| 2010/0177082 A1* | 7/2010 | Joo ...................... G09G 3/3677 345/211 |
| 2012/0105396 A1* | 5/2012 | Sakamoto ............ G09G 3/3677 345/204 |
| 2014/0055411 A1* | 2/2014 | Zhao ...................... G06F 3/044 345/174 |

FOREIGN PATENT DOCUMENTS

| JP | 2000-338919 | 12/2000 |
| JP | 2007-317288 | 12/2007 |
| JP | 2010-250030 | 11/2010 |
| JP | 2011-076708 | 4/2011 |
| WO | 2012/137800 | 10/2012 |

OTHER PUBLICATIONS

Japanese Office Action issued Jul. 28, 2015 in corresponding Japanese Application No. 2013-055243.

* cited by examiner

*Primary Examiner* — Amare Mengistu
*Assistant Examiner* — Gloryvid Figueroa-Gibson
(74) *Attorney, Agent, or Firm* — K&L Gates LLP

(57) ABSTRACT

According to an aspect, a display device includes: a display unit that has a plurality of scanning signal lines to which a scanning signal is applied; a shift register that has a plurality of transfer circuits configured in a plurality of stages that perform a shift operation for temporarily storing a shift signal that has been input and sequentially transmitting the stored shift signal to a subsequent stage in synchronization with a clock signal having a discontinued period, and outputs the scanning signal to a scanning signal line corresponding to a transfer circuit that maintains the shift signal; and a signal line that transmits a holding potential signal for maintaining a potential of the shift signal to a transfer circuit that maintains the shift signal in the discontinued period of the clock signal.

8 Claims, 25 Drawing Sheets

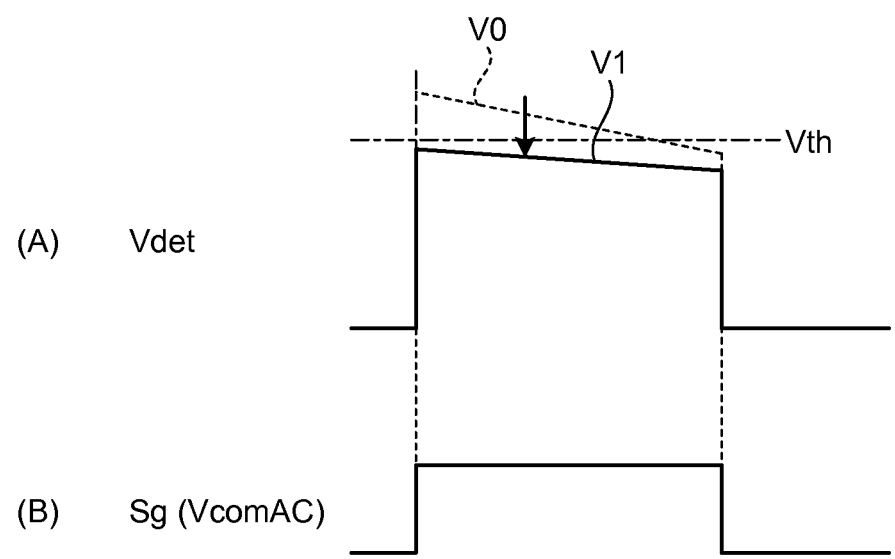

512 FILTER GLASS
510 VIDEO DISPLAY SCREEN UNIT
511 FRONT PANEL

SHUTTER BUTTON
524
LIGHT-EMITTING UNIT
521

DISPLAY UNIT 522
SHUTTER BUTTON 524
523 MENU SWITCH

LENS 532
BODY 531
534 DISPLAY UNIT
533 START/STOP SWITCH

543 DISPLAY UNIT
542 KEYBOARD
541 BODY

551 UPPER HOUSING
554 DISPLAY
552 LOWER HOUSING

UPPER HOUSING
551

552
LOWER HOUSING

552
LOWER HOUSING

551
UPPER HOUSING

LOWER HOUSING
552

553
CONNECTION UNIT

551
UPPER HOUSING

UPPER HOUSING
551

552
LOWER HOUSING

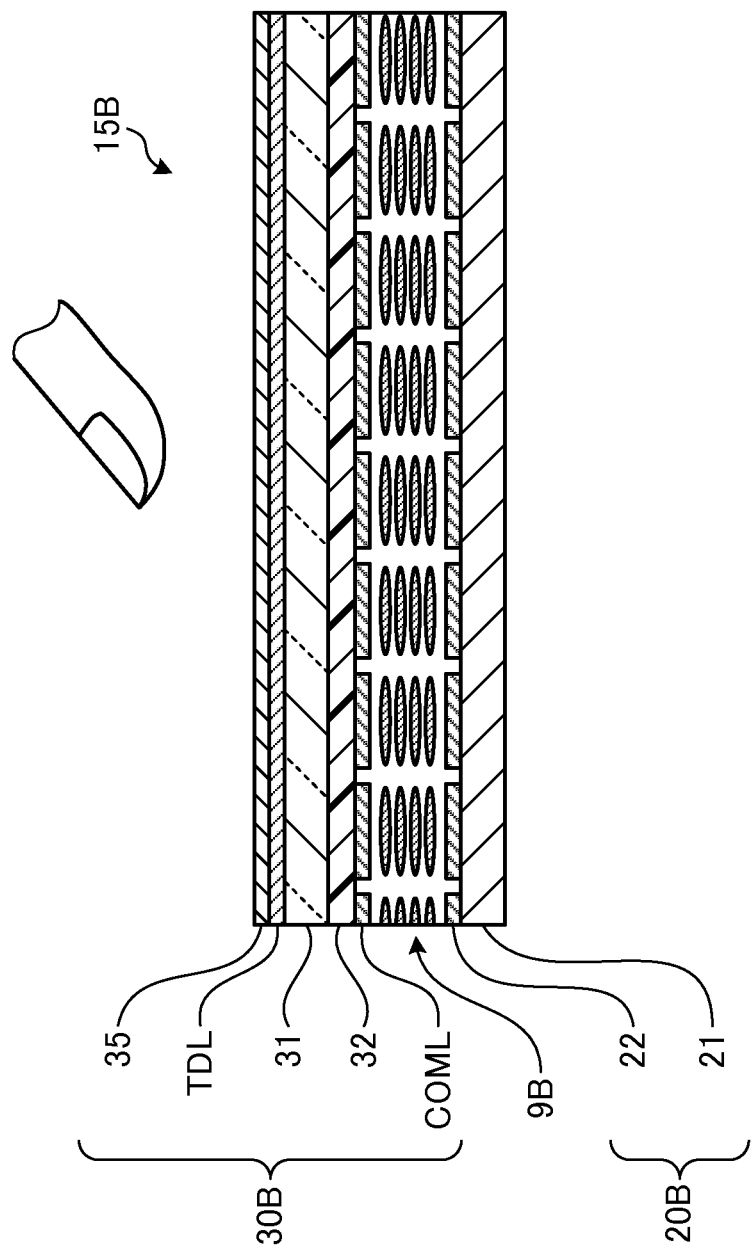

DISPLAY DEVICE AND ELECTRONIC APPARATUS

CROSS REFERENCES TO RELATED APPLICATIONS

The present application claims priority to Japanese Priority Patent Application JP 2013-055243 filed in the Japan Patent Office on Mar. 18, 2013, the entire content of which is hereby incorporated by reference.

BACKGROUND

1. Technical Field

The present disclosure relates to a display device that displays images and an electronic apparatus that includes the display device.

2. Description of the Related Art

Various types of display devices have been developed in recent years from the viewpoint of display quality and/or power consumption. Examples of such display devices include liquid crystal display device, a plasma display device, and an organic electroluminescent (EL) display device. The display devices are applied to a stationary (standing) display device, a mobile phone, a portable information terminal, or other different electronic apparatuses according to the characteristics of such display devices.

Typical display devices display images by line-sequential scanning (sequentially scanning lines) as disclosed in Japanese Patent Application Laid-open Publication No. 2010-250030 (JP-A-2010-250030) and Japanese Patent Application Laid-open Publication No. 2011-76708 (JP-A-2011-76708), for example. Specifically, in a liquid crystal display device, a scanning line signal drive circuit (a gate driver) selects a row (a horizontal line) of pixels as a target for driving for display from pixels arranged in a matrix. A signal line drive circuit (a source driver) supplies pixel signals to the selected pixels. Pixel signals are written therefore on the pixels relating to the selected horizontal line. The display device performs such writing operations of the pixel signals while sequentially scanning the display surface overall, thereby displaying images.

In the display device, there is a case where the line-sequential scanning is repeatedly stopped and restarted to perform the line-sequential scanning for the whole of the display surface intermittently. In such a case, it is desirable that a decrease in display quality be suppressed.

For the foregoing reasons, there is a need for a display device and an electronic that is capable of suppressing a decrease in display quality while intermittent line-sequential scanning is performed.

SUMMARY

According to an aspect, a display device includes: a display unit that has a plurality of scanning signal lines to which a scanning signal is applied; a shift register that has a plurality of transfer circuits configured in a plurality of stages that perform a shift operation for temporarily storing a shift signal that has been input and sequentially transmitting the stored shift signal to a subsequent stage in synchronization with a clock signal having a discontinued period, and outputs the scanning signal to a scanning signal line corresponding to a transfer circuit that maintains the shift signal; and a signal line that transmits a holding potential signal for maintaining a potential of the shift signal to a transfer circuit that maintains the shift signal in the discontinued period of the clock signal.

According to another aspect, an electronic apparatus includes: the display device; and a control device that supplies an input signal to the display device.

Additional features and advantages are described herein, and will be apparent from the following Detailed Description and the figures.

BRIEF DESCRIPTION OF THE FIGURES

FIG. 3 is a diagram illustrating an example of waveforms of a drive signal and a touch detection signal;

FIG. 33 is a sectional view illustrating a modification of the schematic sectional structure of the display unit with a touch sensor according to the embodiment.

DETAILED DESCRIPTION

An embodiment according to the present disclosure will be described in detail in the following order with reference to the accompanying drawings.

Figure 1A:
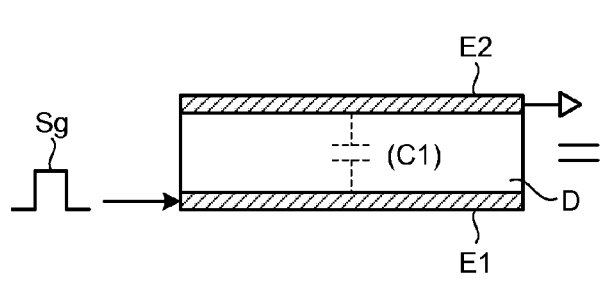
FIGS. 1A and 1B are diagrams illustrating a state in which a finger does not touch or approach a display device for explaining the basic principle of a touch detection system in the display device.
Figure 1B:
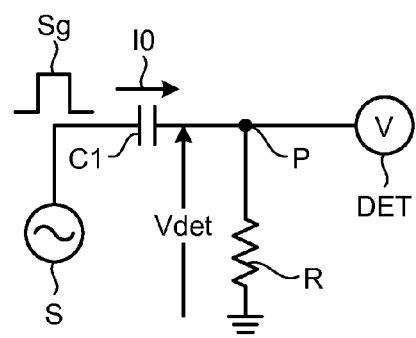

1. Basic principle of electrostatic capacitance touch detection system
2. Embodiment
3. Application examples
4. Aspects of present disclosure 1. Basic Principle of Electrostatic Capacitance Touch Detection System Firstly described is the basic principle of a touch detection system in a display device with reference to FIGS. 1 to 3. The touch detection system is embodied as a touch sensor of an electrostatic capacitance system. As illustrated in FIG. 1A, in the touch detection system, a capacitive element is configured with a pair of electrodes disposed that is opposed to each other across a dielectric D, i.e., a drive electrode E1 and the touch detection electrode E2. This configuration is represented as an equivalent circuit illustrated in FIG. 1B. A capacitive element C1 is configured with the drive electrode E1, the touch detection electrode E2, and the dielectric D. One end of the capacitive element C1 is coupled to an alternate current (AC) signal source (a drive signal source) S and the other end P of the capacitive element C1 is grounded through a resistor R and coupled to a voltage detector (a touch detection circuit) DET. If a predetermined frequency (e.g., several of kHz to several hundreds of kHz) of an AC rectangular waveform Sg ((B) in FIG. 3) is applied from the AC signal source S to the drive electrode E1 (one end of the capacitive element C1), an output waveform as represented by (A) in FIG. 3 (a touch detection signal Vdet) appears in the touch detection electrode E2 (the other end P of the capacitive element 1). The AC rectangular waveform Sg is equivalent to an AC drive signal VcomAC described later.

In a state in which a finger does not touch (or approach) the display device (untouched state), as illustrated in FIG. 1, discharging and charging of the electrostatic capacitance C1 causes an electric current I0 to flow corresponding to the value of the electrostatic capacitance C1. The potential waveform at the other end P of the electrostatic capacitance C1 appears like the waveform V0 of (A) illustrated in FIG. 3, for example, which is detected by the voltage detector DET.

Figure 2A:
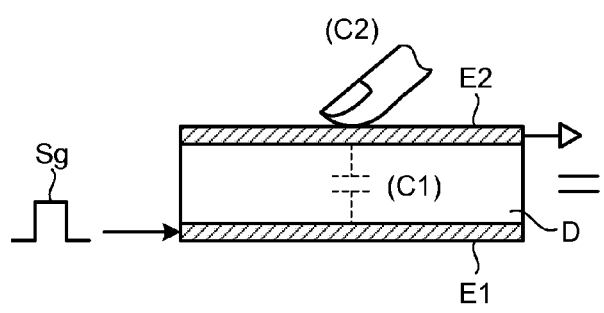
FIGS. 2A and 2B are diagrams illustrating a state in which a finger touches or approaches the display device
Figure 2B:
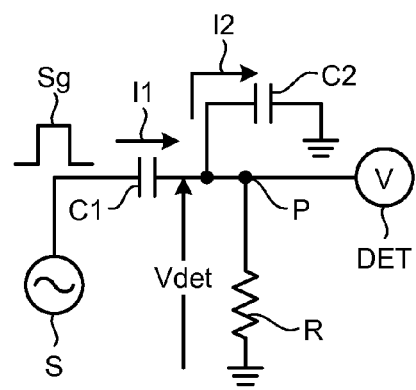

In a state in which a finger touches (or approaches) the touch detection apparatus (touched state), as illustrated in FIGS. 2A and 2B, an electrostatic capacitance C2 generated by the finger is added to the electrostatic capacitance C1 in serial. In this state, discharging and charging of the electrostatic capacitances C1 and C2 causes the electric currents I1 and I2 to flow, respectively. The potential waveform at the other end P of the electrostatic capacitance C1 appears like the waveform V1 of (A) illustrated in FIG. 3, for example, which is detected by the voltage detector DET. The potential of the other end P is a divided voltage potential determined by the values of the electric currents I1 and I2 flowing through the electrostatic capacitances C1 and C2 respectively. The waveform V1 thus has a value smaller than that of the waveform V0 in the untouched state. The voltage detector DET compares the detected voltage to a predetermined threshold voltage Vth. If the detected voltage is equal to or larger than the threshold voltage Vth, the voltage detector DET determines that the display device is in the untouched state. If the detected voltage is less than the threshold voltage Vth, the voltage detector DET determines that the display device is in the touched state. In this manner, touch detection can be achieved.

2. Embodiment

2-1. Configuration Example

Overall Configuration Example

Figure 4:
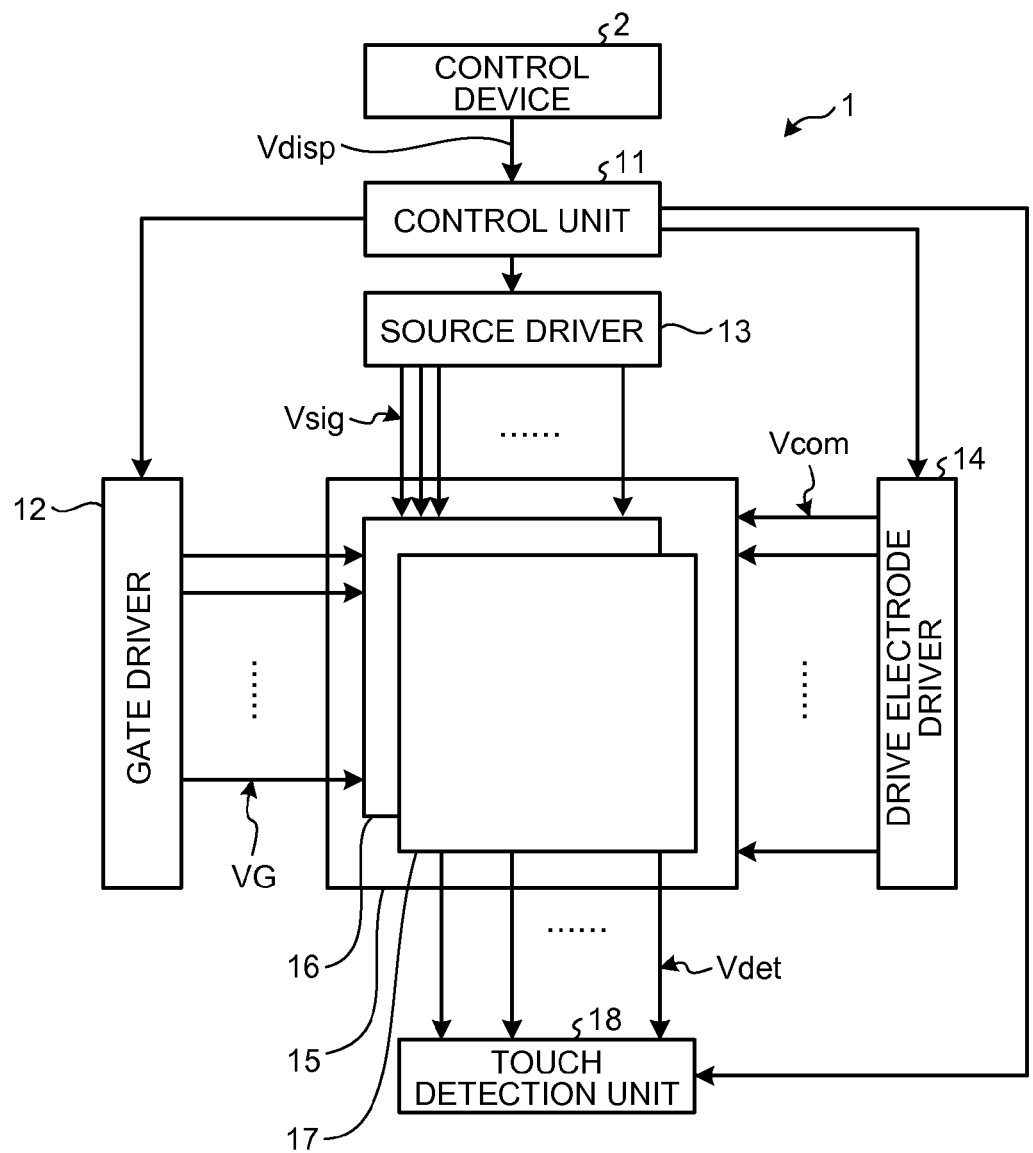
FIG. 4 is a block diagram illustrating a configuration example of the display device according to an embodiment of the present disclosure.

FIG. 4 is a diagram illustrating a configuration example of a display device 1 according to an embodiment of the present disclosure. The display device 1 is called an in-cell display device in which a liquid crystal display panel and an electrostatic capacitance touch panel are integrated with each other.

The display device 1 includes a control unit 11, a gate driver 12, a source driver 13, a drive electrode driver 14, a display unit with a touch sensor 15, and a touch detection unit 18.

The control unit 11 is a circuit that supplies control signals to the gate driver 12, the source driver 13, the drive electrode 14, and the touch detection unit 18 according to a video signal Vdisp supplied from a control device 2, and controls them so as to operate in a synchronized manner to each other.

The gate driver 12 has a function as a scanning line signal drive circuit for sequentially selecting horizontal lines one by one targeted for driving for display by the display unit with a touch sensor 15 according to the control signal transmitted from the control unit 11. Specifically, the gate driver 12 supplies, as described later, scanning signals VG to the display unit with a touch sensor 15, thereby sequentially selecting rows (horizontal lines) of the pixels one by one from pixels Pix arranged in a matrix on a liquid crystal display unit 16 (described later) of the display unit with a touch sensor 15 as a target for driving for display.

The source driver 13 is a circuit that supplies a pixel signal Vsig to the pixels Pix of the liquid crystal display unit 16 (described later), according to the control signal transmitted from the control unit 11. Specifically, the source driver 13 supplies the pixel signal Vsig to each pixel Pix included in the horizontal line selected as a target for driving for display as described later.

The drive electrode driver 14 is a circuit that supplies a drive signal Vcom to a drive electrode COML (described later) of the display unit with a touch sensor 15 according to the control signals supplied from the control unit 11. Specifically, the drive electrode driver 14 sequentially applies the AC drive signals VcomAC (described later) to the drive electrodes COML targeted for driving for touch detection in a time-division manner, and applies DC drive signals VcomDC (described later) to the other drive electrodes COML, as described later.

The display unit with a touch sensor 15 is a display unit that incorporates a touch sensor and includes the liquid crystal display unit 16 and a touch sensor unit 17. The liquid crystal display unit 16 sequentially scans horizontal lines one by one and displays the scanned lines according to a scanning signal VG supplied from the gate driver 12. The touch sensor unit 17 operates according to the above-described basic principle of the electrostatic capacitance touch detection system. The touch sensor unit 17 outputs the touch detection signal Vdet according to the AC drive signal VcomAC supplied from the drive electrode driver 14, thereby sequentially scanning for touch detection.

The touch detection unit 18 detects an external approaching object according to the control signal supplied from the control unit 11 and the touch detection signal Vdet supplied from the touch sensor unit 17.

This configuration enables the display device 1 to achieve a touch detection operation while performing a display operation according to a video signal Vdisp. Specifically, the display device 1 achieves the display operations by sequentially scanning the lines, and achieves the touch detection operations while the display operation is discontinued as described later.

Display Unit with a Touch Sensor 15

An example structure of the display unit with a touch sensor 15 will be now explained.

Figure 5:
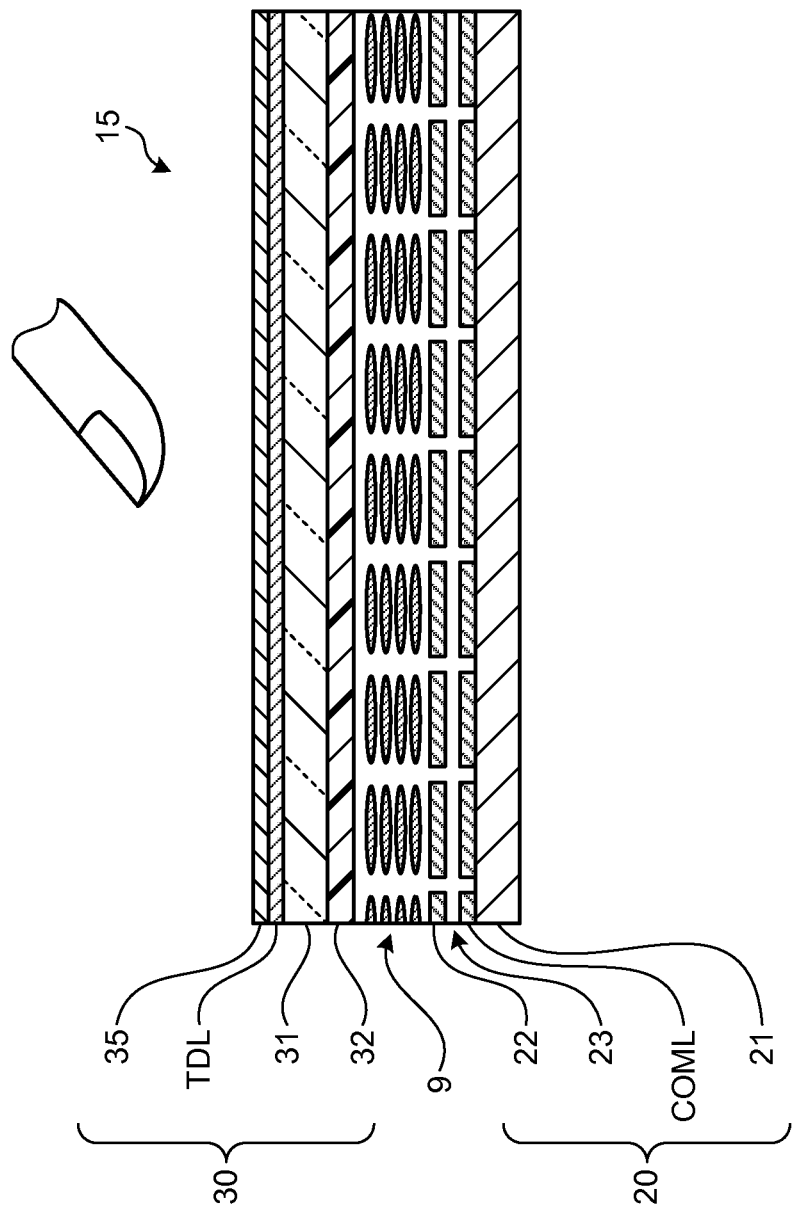
FIG. 5 is a sectional view illustrating the schematic sectional structure of a display unit with a touch sensor illustrated in FIG. 4.

FIG. 5 illustrates an example of the sectional structure of the relevant part of the display unit with a touch sensor 15. The display unit with a touch sensor 15 includes a pixel substrate 20, a counter substrate 30 disposed so as to be opposed to the pixel substrate 20, and a liquid crystal layer 9 provided between the pixel substrate 20 and the counter substrate 30.

The pixel substrate 20 has a thin film transistor (TFT) substrate 21 as a circuit substrate, drive electrodes COML, and pixel electrodes 22. The TFT substrate 21 functions as a circuit substrate including various types of electrodes, wiring (e.g., a pixel signal line SGL, a scanning signal line GCL, etc. described later), and a thin film transistor (TFT). The TFT substrate 21 is made of glass, for example. The TFT substrate 21 has thereon drive electrodes COML, which are electrodes for supplying a common voltage to a plurality of pixels Pix (described later). The drive electrode COML functions as a common drive electrode for a liquid crystal display operation and also functions as a drive electrode for a touch detection operation. The drive electrode COML has thereon an insulating layer 23 on which pixel electrodes 22 are provided. The pixel electrode 22 is an electrode for supplying a pixel signal for display and is translucent. The drive electrode COML and the pixel electrode 22 are made of indium tin oxide (ITO), for example.

The counter substrate 30 includes a glass substrate 31, a color filter 32, and a touch detection electrode TDL. The color filter 32 is provided on one surface of the glass substrate 31. In the color filter 32, three color filter layers of red (R), green (G), and blue (B) are periodically arranged, for example. A group of the R, G, and B layers is associated with each of the pixels for display. The touch detection electrode TDL is provided on the other side surface of the glass substrate 31. The touch detection electrode TDL is an electrode made of ITO, for example, and is translucent. A polarizing plate 35 is provided on the touch detection electrode TDL.

The liquid crystal layer 9 functions as a display function layer and modulates light passing through itself according to the state of the electric field. The electric field is generated by the potential difference between the voltage of the drive electrode COML and the voltage of the pixel electrode 22. For the liquid crystal layer 9, horizontal electric field mode liquid crystals are used, such as a fringe-field switching (FFS) mode and an in-plane switching (IPS) mode.

An orientation film is interposed between the liquid crystal layer 9 and the pixel substrate 20, and between the liquid crystal layer 9 and the counter substrate 30. An incident-side polarizing plate is provided at the lower side of the pixel substrate 20, of which illustration is omitted.

Figure 6:
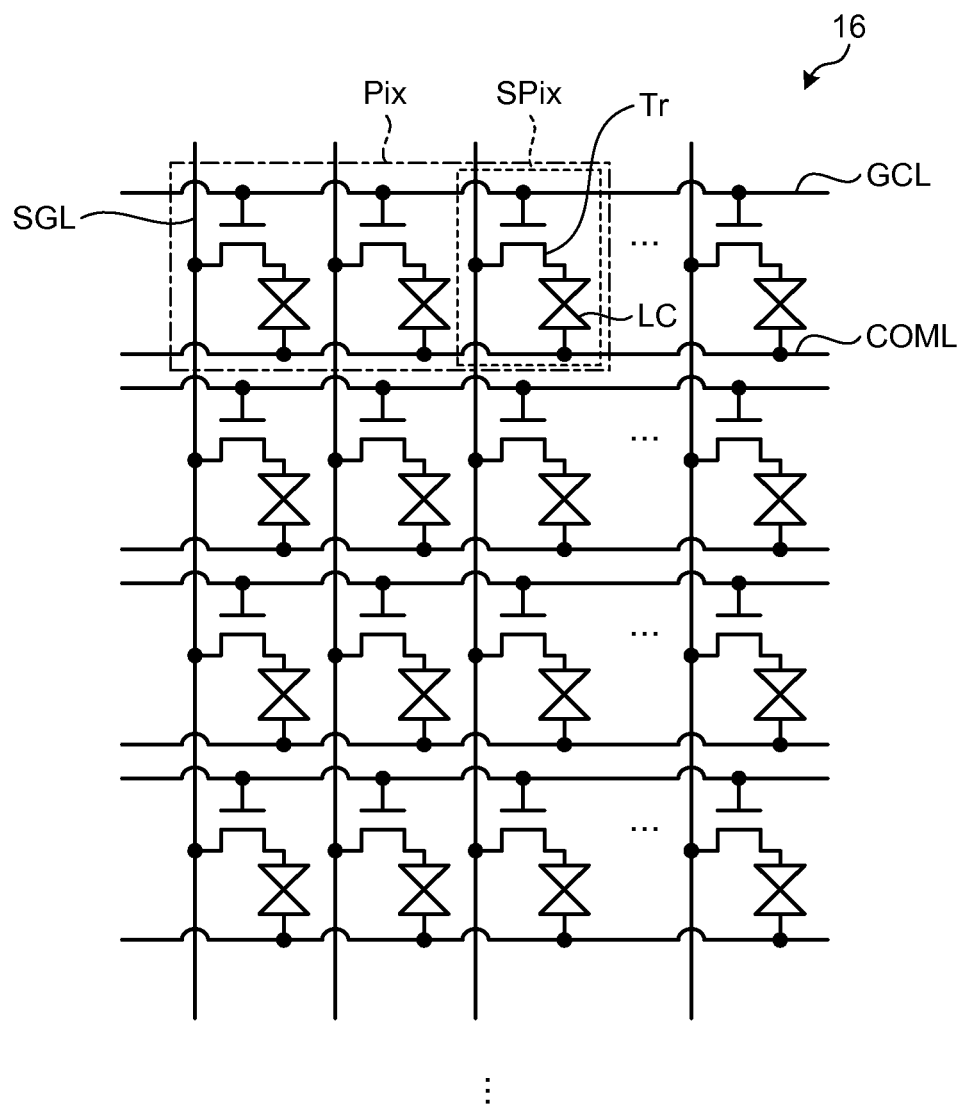
FIG. 6 is a circuit diagram illustrating the pixel arrangement in the display unit with a touch sensor illustrated in FIG. 4.

FIG. 6 illustrates an example of the pixel structure of the liquid crystal display unit 16. The liquid crystal display unit 16 has a plurality of pixels Pix arranged in a matrix. Each of the pixels Pix includes three subpixels SPix. The three subpixels SPix are arranged so as to correspond to the three colors (RGB) of the color filter 32 illustrated in FIG. 5. The subpixel SPix has a TFT element Tr and a liquid crystal element LC. The TFT element Tr is a thin film transistor, achieved with an n-channel metal oxide semiconductor (MOS) TFT in this example. The source of the TFT element Tr is coupled to the pixel signal line SGL, the gate of the TFT element Tr is coupled to the scanning signal line GCL, the drain of the TFT element Tr is coupled to one end of the liquid crystal device LC. One end of the liquid crystal device LC is coupled to the drain of the TFT element Tr and the other end of the liquid crystal device LC is coupled to the drive electrode COML.

Each subpixel SPix is coupled to the other subpixels SPix included in a common row of the liquid crystal display unit 16, via the scanning signal line GCL. The scanning signal line GCL is coupled to the gate driver 12. The gate driver 12 supplies the scanning signal VG to the scanning signal line GCL. Each subpixel SPix is coupled to the other subpixels SPix included in a common row of the liquid crystal display unit 16, via the pixel signal line SGL. The pixel signal line SGL is coupled to the source driver 13. The source driver 13 transmits the pixel signal Vsig to the pixel signal line SGL.

Each subpixel SPix is coupled to the other subpixels SPix included in a common row of the liquid crystal display unit 16, via the drive electrode COML. The drive electrode COML is coupled to the drive electrode driver 14. The drive electrode driver 14 supplies the DC drive signal VcomDC to the drive electrode COML in a display operation.

In the liquid crystal display unit 16, the gate driver 12 drives so as to sequentially scan the scanning signal lines GCL in a time-division manner, thereby sequentially selecting the horizontal lines one by one. The source driver 13 transmits the pixel signal Vsig to the pixel Pix included in the selected horizontal line, whereby horizontal lines are displayed one by one.

Figure 7:
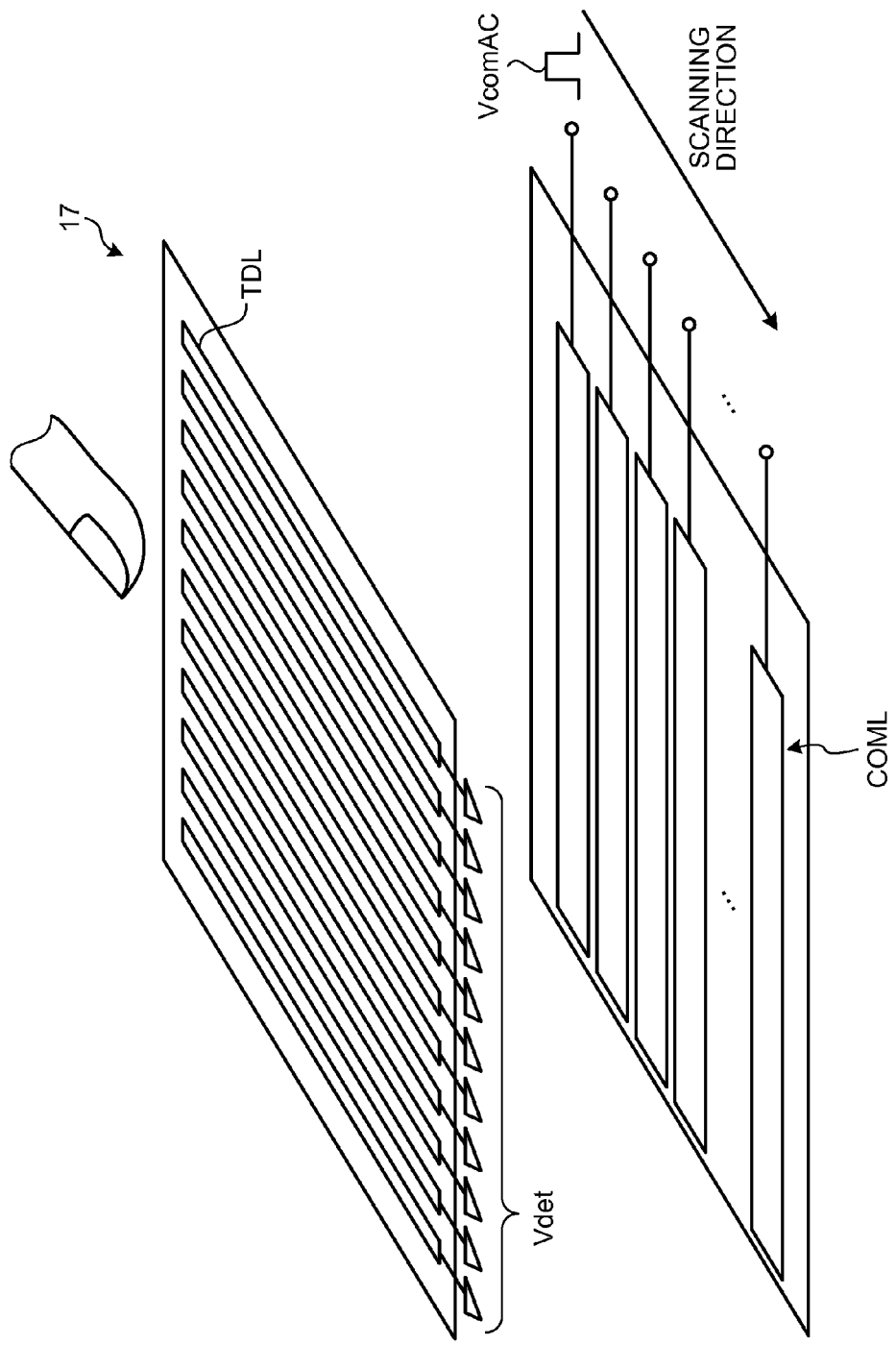
FIG. 7 is a perspective view illustrating a configuration example of a drive electrode and a configuration example of a touch detection electrode in the display unit with a touch sensor illustrated in FIG. 4.

FIG. 7 is a perspective view of a configuration example of the touch sensor unit 17. The touch sensor unit 17 includes a drive electrode COML provided on the pixel substrate 20, and a touch detection electrode TDL provided on the counter substrate 30. The drive electrode COML has belt-like patterns of electrodes extending in a lateral direction in FIG. 7. The touch detection electrode TDL has belt-like patterns of electrodes extending in the direction perpendicular to the electrode pattern of the drive electrode COML. Each of the electrode patterns of the touch detection electrode TDL is coupled to the touch detection unit 18. The electrode pattern of the drive electrode COML and the electrode pattern of the touch detection electrode TDL intersect with each other to form an electrostatic capacitance on the intersecting portions.

This configuration enables the drive electrode driver 14 to apply the AC drive signal VcomAC to the drive electrode COML, thereby outputting the touch detection signal Vdet from the touch detection electrode TDL so that touch detection is achieved in the touch sensor unit 17. That is, the drive electrode COML corresponds to the drive electrode E1 and the touch detection electrode TDL corresponds to the touch detection electrode E2 in the basic principle of touch detection illustrated in FIGS. 1 to 3. The touch sensor unit 17 can detect touch operations according to the basic principle. As illustrated in FIG. 7, the electrode patterns intersecting with each other form electrostatic capacitance touch sensors in a matrix. Accordingly, scanning overall the touch detection surface of the touch sensor unit 17 can detect the position on which an external approaching object touches or the position to which an external approaching object approaches.

Gate Driver 12

The gate driver 12 will now be described. The gate driver 12 sequentially and intermittently scans the horizontal lines of the liquid crystal display unit 16, i.e., performs intermittent line-sequential scanning thereby sequentially selecting the horizontal lines one by one.

Figure 8:
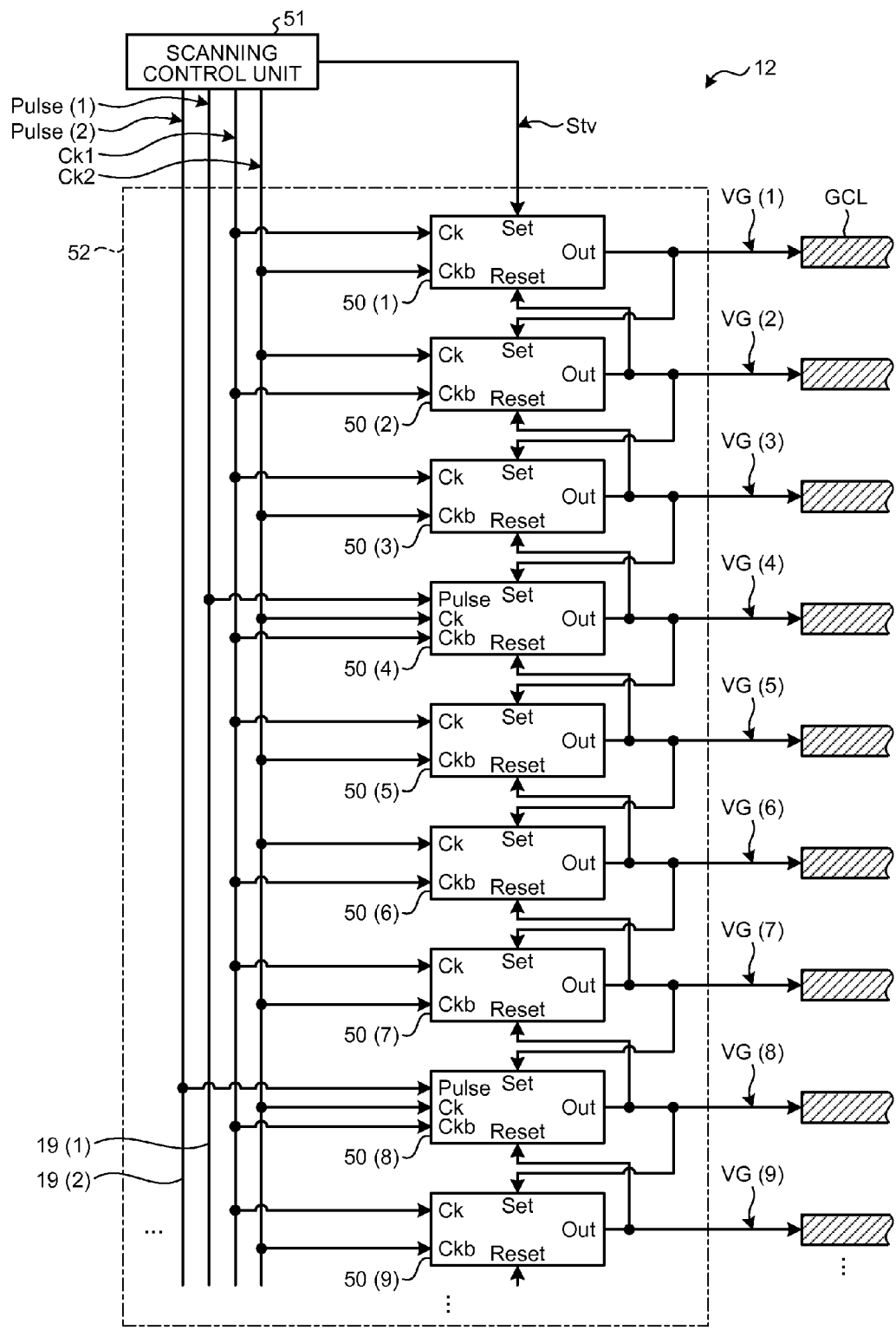
FIG. 8 is a block diagram illustrating a configuration example of a gate driver according to the embodiment.

FIG. 8 illustrates a configuration example of the gate driver 12 that includes a scanning control unit 51 and a shift register 52.

The scanning control unit 51 generates control signals Stv, clock signals Ck1 and Ck2, and holding potential signals pulse(1), pulse(2), . . . according to not-illustrated control signals supplied from the control unit 11, and supplies them to the shift register 52. The control signal Stv is a signal forwarded by the shift register 52.

The clock signals Ck1 and Ck2 are clock signals for the shift register 52 to forward (shift) signals. While the display device 1 stops the display operation and performs the touch detection operation, the supply of the clock signals Ck1 and Ck2 is stopped. The period during which the supply of the clock signals Ck1 and Ck2 is stopped may be called a "discontinued period", hereinafter.

The holding potential signals pulse(1), pulse(2), . . . are signals input to any transfer circuit 50 included in the shift register 52 and maintaining forwarded signals through a forwarding operation in the discontinued period of the clock signals Ck1 and Ck2. The holding potential signals pulse(1), pulse(2), . . . are signals for maintaining the potential of the signals set in the transfer circuit 50. The holding potential signals pulse(1), pulse(2), . . . are input to the transfer circuit 50 through the holding potential signal lines 19(1), 19(2), . . . .

The shift register 52 generates scanning signals VG(1), VG(2), . . . that are supplied to scanning signal lines GCL of the liquid crystal display unit 16, according to the control signals supplied from the scanning control unit 51. The shift register 52 is made of amorphous silicon on the pixel substrate 20 illustrated in FIG. 5, in this example. The shift register 52 includes transfer circuits 50(1), 50(2), . . . . In this example, the holding potential signal pulse(1) is input to the transfer circuit 50(4) and the holding potential signal pulse(2) is input to the transfer circuit 50(8).

The scanning signal VG represents hereinafter as appropriate an arbitrary one of scanning signals VG(1), VG(2), . . . . In the same manner, the transfer circuit 50 represents as appropriate an arbitrary one of the transfer circuits 50(1), 50(2), . . . . The holding potential signal pulse represents an arbitrary one of the holding potential signals pulse(1), pulse(2), . . . . The holding potential signal line 19 represents hereinafter as appropriate an arbitrary one of the holding potential signal lines 19(1), 19(2), . . . .

The transfer circuit 50 is a circuit that performs a shift operation by temporarily storing a shift signal having been input and sequentially transmitting the stored shift signal to the subsequent stages in synchronization with the clock signals Ck1 and Ck2. If the transfer circuit 50 stores a shift signal, the transfer circuit 50 supplies an output signal of the shift signal (a scanning signal VG) to a corresponding scanning signal line GCL. The shift signals are sequentially supplied from the scanning control unit 51 and transmitted to the subsequent stage trough the shift operations of the transfer circuit 50.

Each transfer circuit 50 includes input terminals Ck and Ckb, input terminals Set and Reset, and an output terminal Out. The holding potential signal line 19 is coupled to the transfer circuit 50 storing shift signals in the discontinued period of the clock signals Ck1 and Ck2. The holding potential signal pulse for maintaining the potential of the stored shift signal is supplied to the transfer circuit 50 in the discontinued period.

One of the clock signal Ck1 and the clock signal Ck2 is supplied to the input terminal Ck of each transfer circuit 50 in an alternate manner for each transfer circuit. Specifically, the clock signal Ck1 is supplied to the input terminal Ck of the transfer circuits 50(1), 50(3), 50(5), . . . , while the clock signal Ck2 is supplied to the input terminal Ck of the transfer circuits 50(2), 50(4), 50(6), . . . . The clock signal Ck1 or the clock signal Ck2 having not been input to the input terminal Ck is supplied to the input terminal Ckb of each transfer circuit 50. Specifically, the clock signal Ck2 is supplied to the input terminal Ckb of the transfer circuits 50(1), 50(3), 50(5), . . . . The clock signal Ck1 is supplied to the input terminal Ckb of the transfer circuits 50(2), 50(4), 50(6), . . . .

In the example illustrated in FIG. 8, an output signal from the upper transfer circuit 50 (i.e., the transfer circuit at the previous stage) of each transfer circuit 50 is supplied to the input terminal Set. By contrast, an output signal from the lower transfer circuit 50 (i.e., the transfer circuit at the subsequent stage) of each transfer circuit 50 is supplied to the input terminal Reset.

Each transfer circuit 50 outputs the signal that has been input to the input terminal Set or the input terminal Reset from the output terminal Out in synchronization with the clock signals Ck1 and Ck2. The transfer circuit 50 supplies the output signal (the scanning signal VG) to the adjacent transfer circuits 50 and to the scanning signal lines GCL of the liquid crystal display unit 16.

Figure 9:
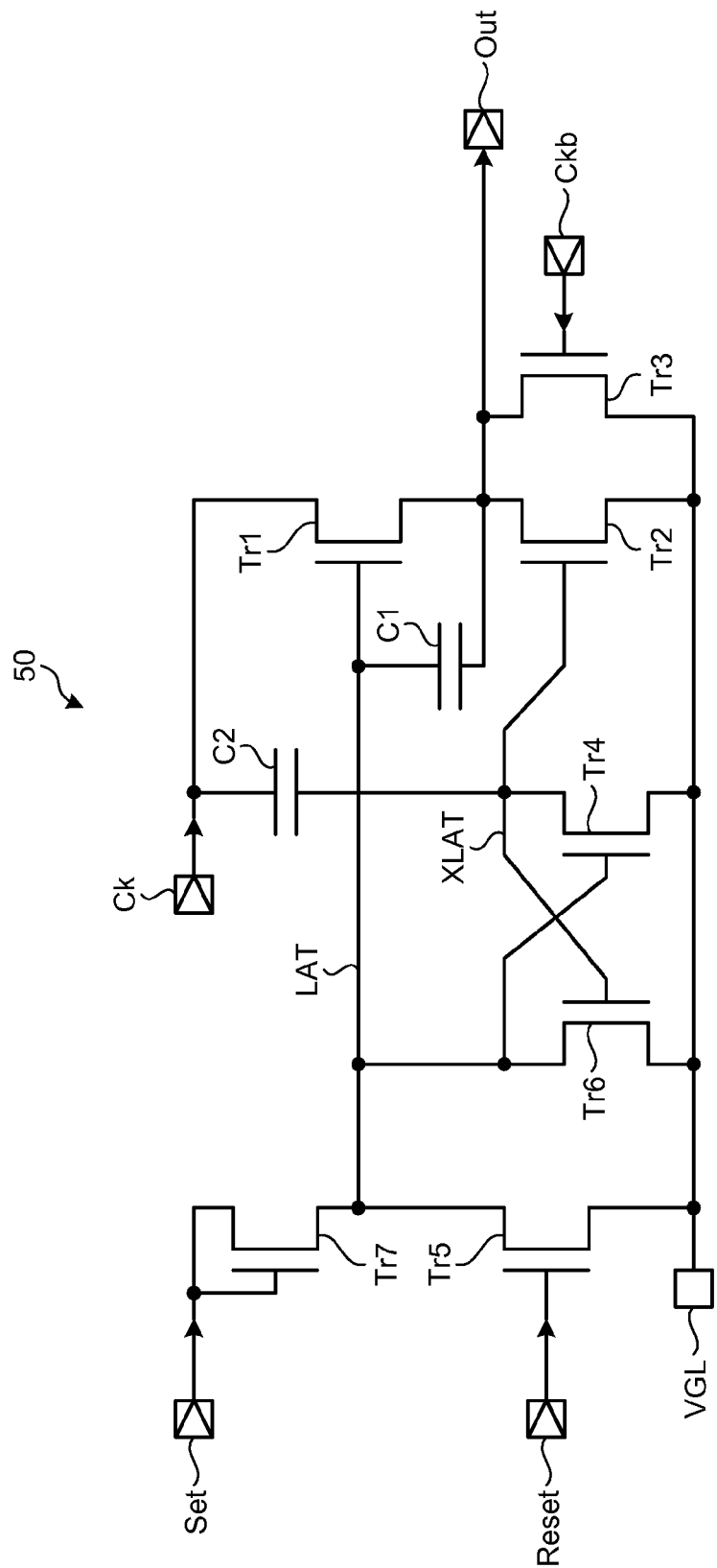
FIG. 9 is a circuit diagram illustrating a configuration example of a transfer circuit illustrated in FIG. 8.

FIG. 9 illustrates a configuration example of the transfer circuit 50. The transfer circuit 50 includes transistors Tr1 to Tr7 and capacitive elements C1 and C2. The transistors Tr1 to Tr7 are n-channel metal oxide semiconductor (MOS) transistors. The gate and the source of the transistor Tr7 are coupled to the input terminal Set, and the drain of the transistor Tr7 is coupled to a node LAT. The gate of the transistor Tr5 is coupled to the input terminal Reset, the source of the transistor Tr5 is coupled to a ground terminal VGL, and the drain of the transistor Tr5 is coupled to the node LAT. The gate of the transistor Tr4 is coupled to the node LAT, the drain of the transistor Tr4 is coupled to a node XLAT, and the source of the transistor Tr4 is coupled to the ground terminal VGL. The gate of the transistor Tr6 is coupled to the node XLAT, the drain of the transistor Tr6 is coupled to the node LAT, and the source of the transistor Tr6 is coupled to the ground terminal VGL. The gate of the transistor Tr2 is coupled to the node XLAT, the drain of the transistor Tr2 is coupled to the output terminal Out, and the source of the transistor Tr2 is coupled to the ground terminal VGL. The gate of the transistor Tr1 is coupled to the node LAT, the drain of the transistor Tr1 is coupled to the input terminal Ck, and the source of the transistor Tr1 is coupled to the output terminal Out. The gate of the transistor Tr3 is coupled to the input terminal Ckb, the drain of the transistor Tr3 is coupled to the output terminal Out, and the source of the transistor Tr3 is coupled to the ground terminal VGL. One end of the capacitive element C2 is coupled to the input terminal Ck and the other end of the capacitive element C2 is coupled to the node XLAT. One end of the capacitive element C1 is coupled to the node LAT and the other end of the capacitive element C1 is coupled to the output terminal Out.

In the transfer circuit 50 configured as described above, the node LAT coupled to the capacitive element C1 functions as a latch part. When the potential H is maintained on the node LAT, the transistor Tr1 is turned On, thereby outputting the scanning signal VG from the output terminal Out. Hereinafter, the potential higher than a predetermined threshold may be referred to as a "potential H" and the potential lower than the predetermined threshold may be referred to as a "potential L".

FIG. 9 illustrates a configuration example of the transfer circuit 50 disposed in a stage where the potential of the shift signal is not maintained in the discontinued period of the clock signals Ck1 and Ck2. With the configuration illustrated in FIG. 9, if the supply of the clock signals Ck1 and Ck2 is stopped in a state where the transfer circuit 50 maintains the shift signal, that is, the potential H is maintained on the node LAT, the potential maintained on the node LAT decreases due to an off-leak of the transistor, for example. If the potential maintained on the node LAT decreases, the waveform of the scanning signal VG output from the transfer circuit 50 weakens, whereby the display quality may decrease.

Figure 10:
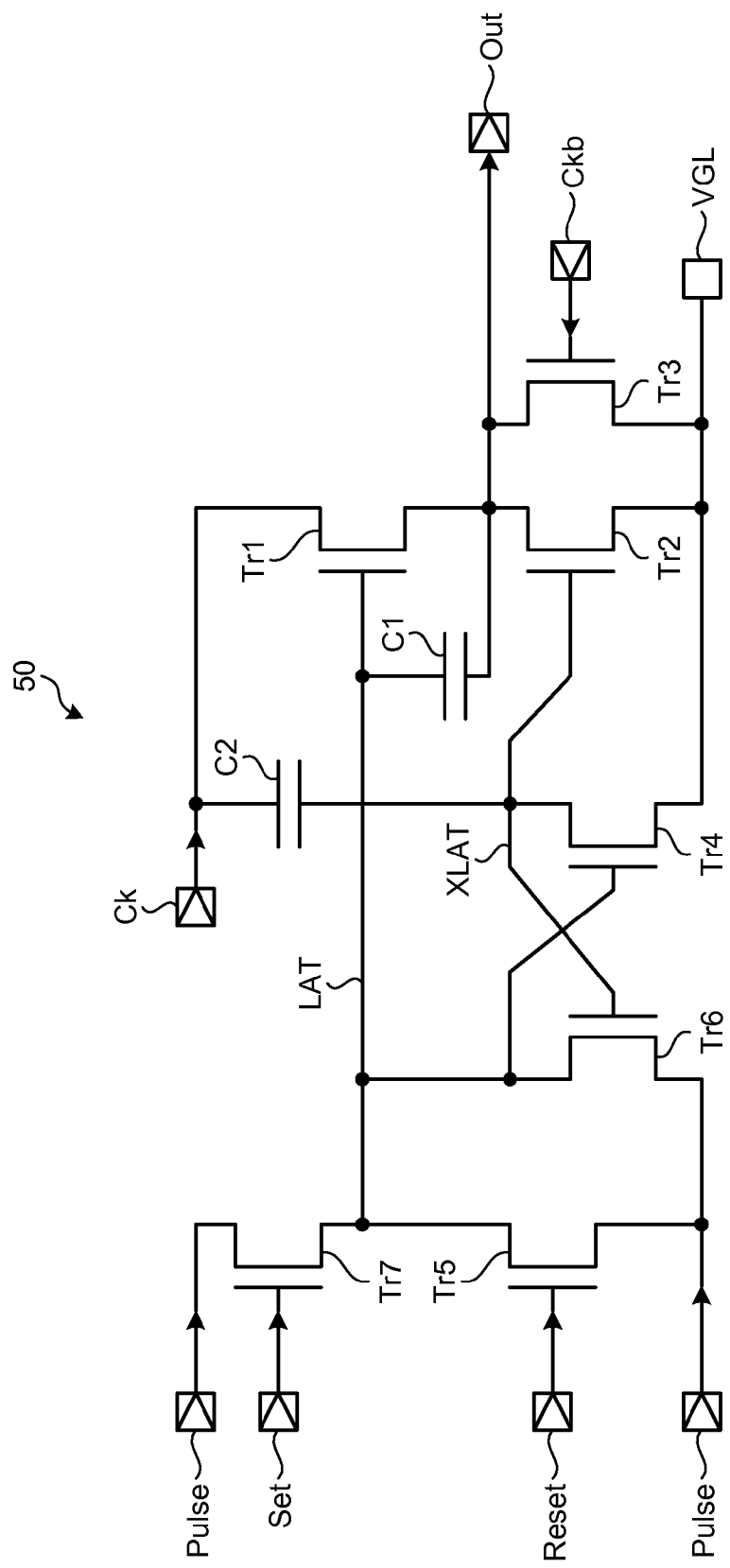
FIG. 10 is a circuit diagram illustrating a configuration example of a transfer circuit to which a holding potential signal is input illustrated in FIG. 8.

FIG. 10 illustrates a configuration example of the transfer circuit 50 disposed in a stage where the potential of the shift signal can be maintained in the discontinued period of the clock signals Ck1 and Ck2. The transfer circuit 50 illustrated in FIG. 10 differs from the transfer circuit 50 illustrated in FIG. 9 in that the gate of the transistor Tr7 is coupled to the input terminal Set and the source of the transistor Tr7 is coupled to the input terminal Pulse. In addition, the source of the transistor Tr5 and the source of the transistor Tr6 are coupled to the input terminal Pulse. To the input terminal Pulse, the holding potential signal pulse for maintaining the potential H that has been set in the transfer circuit 50 is input. Other configurations of the transfer circuit illustrated in FIG. 10 are the same as the configurations described with reference to FIG. 9.

Using the two configuration types of transfer circuit 50 as described above enables the shift register 52 to forward the signal supplied from the transfer circuit at the previous stage to the transfer circuit at the subsequent stage. Operations of the shift register 52 will now be described below. A control signal Stv is supplied to the input terminal Set of the uppermost transfer circuit 50(1) of the shift register 52.

For simplifying the description, the four stages, i.e., the transfer circuits 50(1), 50(2), 50(3), and 50(4) of the transfer circuits included in the shift register 52 are focused hereinafter. In this example, the transfer circuit 50(1) at the first stage to the transfer circuit 50(3) at the third stage have the same configuration as the configuration described above with reference to FIG. 9. The transfer circuit 50(4) at the fourth stage has the same configuration as the configuration described above with reference to FIG. 10. The holding potential signal line 19(1) is coupled to the transfer circuit 50(4) at the fourth stage, for supplying the stored holding potential signal pulse(1) to maintain the potential H to the transfer circuit 50(4) in the discontinued period.

Figure 11:
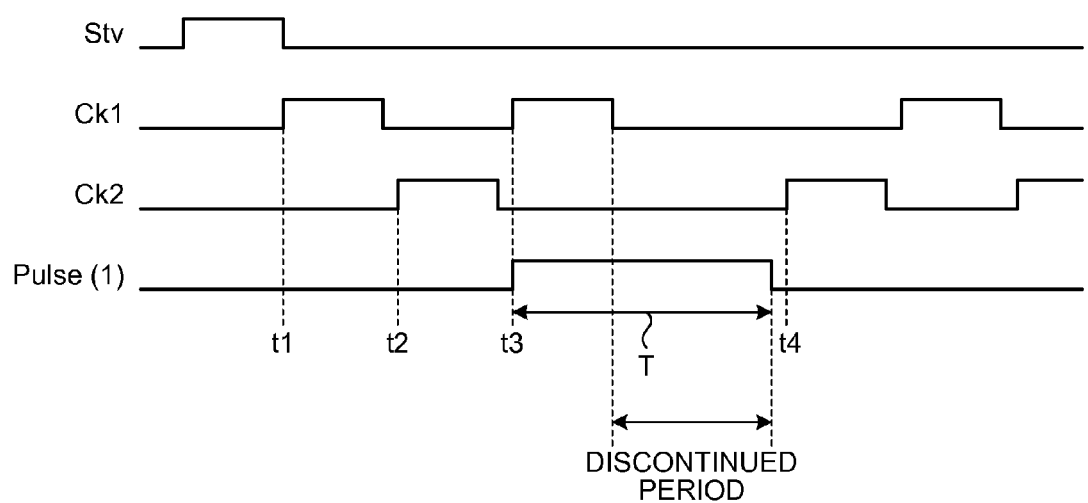
FIG. 11 is a timing waveform diagram illustrating an example of operations of a shift register illustrated in FIG. 8.

FIG. 11 illustrates an example of operations of the shift register 52. In this example, after the clock signal Ck1 is input to the transfer circuit 50(3) at the third stage in the shift register 52, the discontinued period starts.

When the control signal Stv that has been input in the input terminal Set of the transfer circuit 50(1) at the first stage in the shift register 52 rises, the node LAT of the transfer circuit 50(1) at the first stage is set to the potential H. After that, at the timing t1 at which the clock signal Ck1 that has been input in the input terminal Ck of the transfer circuit 50(1) rises (the timing of shifting from the potential L to the potential H), the scanning signal VG(1) is output from the output terminal Out of the transfer circuit 50(1).

The signal output from the output terminal Out of the transfer circuit 50(1) is also input to the input terminal Set of the transfer circuit 50(2) at the second stage. When the signal is input to the input terminal Set of the transfer circuit 50(2) at the second stage, the node LAT of the transfer circuit 50(2) at the second stage is set to the potential H.

After that, at the timing t2 at which the clock signal Ck2 that has been input in the input terminal Ck of the transfer circuit 50(2) rises, the scanning signal VG(2) is output from the output terminal Out of the transfer circuit 50(2).

The signal output from the output terminal Out of the transfer circuit 50(2) is also input to the input terminal Reset of the transfer circuit 50(1) at the first stage. This cancels the potential H that has been set on the node LAT of the transfer circuit 50(1), and thus changes the node LAT to have the potential L. In addition, the signal output from the output terminal Out of the transfer circuit 50(2) is also input into the input terminal Set of the transfer circuit 50(3) at the third stage. When the signal is input to the input terminal Set of the transfer circuit 50(3) at the third stage, the node LAT of the transfer circuit 50(3) at the third stage is set to the potential H.

After that, at the timing t3 at which the clock signal Ck1 that has been input in the input terminal Ck of the transfer circuit 50(3) rises, the scanning signal VG(3) is output from the output terminal Out of the transfer circuit 50(3).

The signal output from the output terminal Out of the transfer circuit 50(3) is also input to the input terminal Reset of the transfer circuit 50(2) at the second stage. This cancels the potential H that has been set on the node LAT of the transfer circuit 50(2), and thus changes the node LAT to have the potential L. In addition, the signal output from the output terminal Out of the transfer circuit 50(3) is also input to the input terminal Set of the transfer circuit 50(4) at the fourth stage. When the signal is input to the input terminal Set of the transfer circuit 50(4) at the fourth stage, the node LAT of the transfer circuit 50(4) at the fourth stage is set to the potential H.

At the timing t3 at which the clock signal Ck1 rises, the holding potential signal pulse(1) to the input terminal Pulse of the transfer circuit 50(4) at the fourth stage rises, the potential H is maintained while the holding potential signal pulse(1) does not fall until the period T illustrated in FIG. 11 ends. As illustrated in FIG. 11, the period from the point the transmission of the clock signal is stopped to the point the transmission of the clock signal is restarted is the discontinued period of the clock. In the period T illustrated in FIG. 11, the holding potential signal pulse(1) has the potential H. Accordingly, in the transfer circuit 50(4), the source of the transistor Tr7 and the source of the transistor Tr5 illustrated in FIG. 10 have the potential H. In the transfer circuit 50(4), therefore, the node LAT illustrated in FIG. 10 is maintained at the potential H. Specifically, during the period in which the holding potential signal pulse(1) to the input terminal Pulse has the potential H, there is no leak path of the potential H set in the node LAT. This maintains the node LAT illustrated in FIG. 10 to have the potential H.

After that, at the timing t4 at which the transmission of the clock signal is restarted and the clock signal Ck2 that has been input in the input terminal Ck of the transfer circuit 50(4) rises, the scanning signal VG(4) is output from the output terminal Out of the transfer circuit 50(4). The holding potential signal pulse(1) maintains the node LAT of the transfer circuit 50(4) at the potential H in the discontinued period. This enables the transfer circuit 50(4) to preferably output the scanning signal VG(4) after the discontinued period.

2-2. Operations and Actions

The following describes operations and actions of the display device 1 according to the present embodiment.

Outline of Overall Operations

Firstly described is the outline of overall operations of the display device 1 with reference to FIG. 4. The control unit 11 supplies control signals to the gate driver 12, the source driver 13, the drive electrode driver 14, and the touch detection unit 18 based on the video signal Vdisp supplied from the external control device 2 so that they operate in a synchronized manner to each other. The gate driver 12 supplies the scanning signal VG to the liquid crystal display unit 16 of the display unit with a touch sensor 15 and sequentially selects horizontal lines one by one as a target for driving for display. The source driver 13 supplies the pixel signal Vsig to each subpixel SPix included in the horizontal line selected by the gate driver 12. The drive electrode driver 14 sequentially applies the AC drive signals VcomAC to the drive electrodes COML targeted for driving for touch detection and applies the DC drive signals VcomDC to the other drive electrodes COML. The display unit with a touch sensor 15 performs the display operation and the touch detection operation, and thus outputs the touch detection signal Vdet from the touch detection electrode TDL. The touch detection unit 18 detects an external approaching object based on the touch detection signal Vdet supplied from the touch sensor unit 17 of the display unit with a touch sensor 15.

Detailed Operations

The following describes operations of the display device 1 in detail with reference to some of the accompanying drawings.

Figure 12:
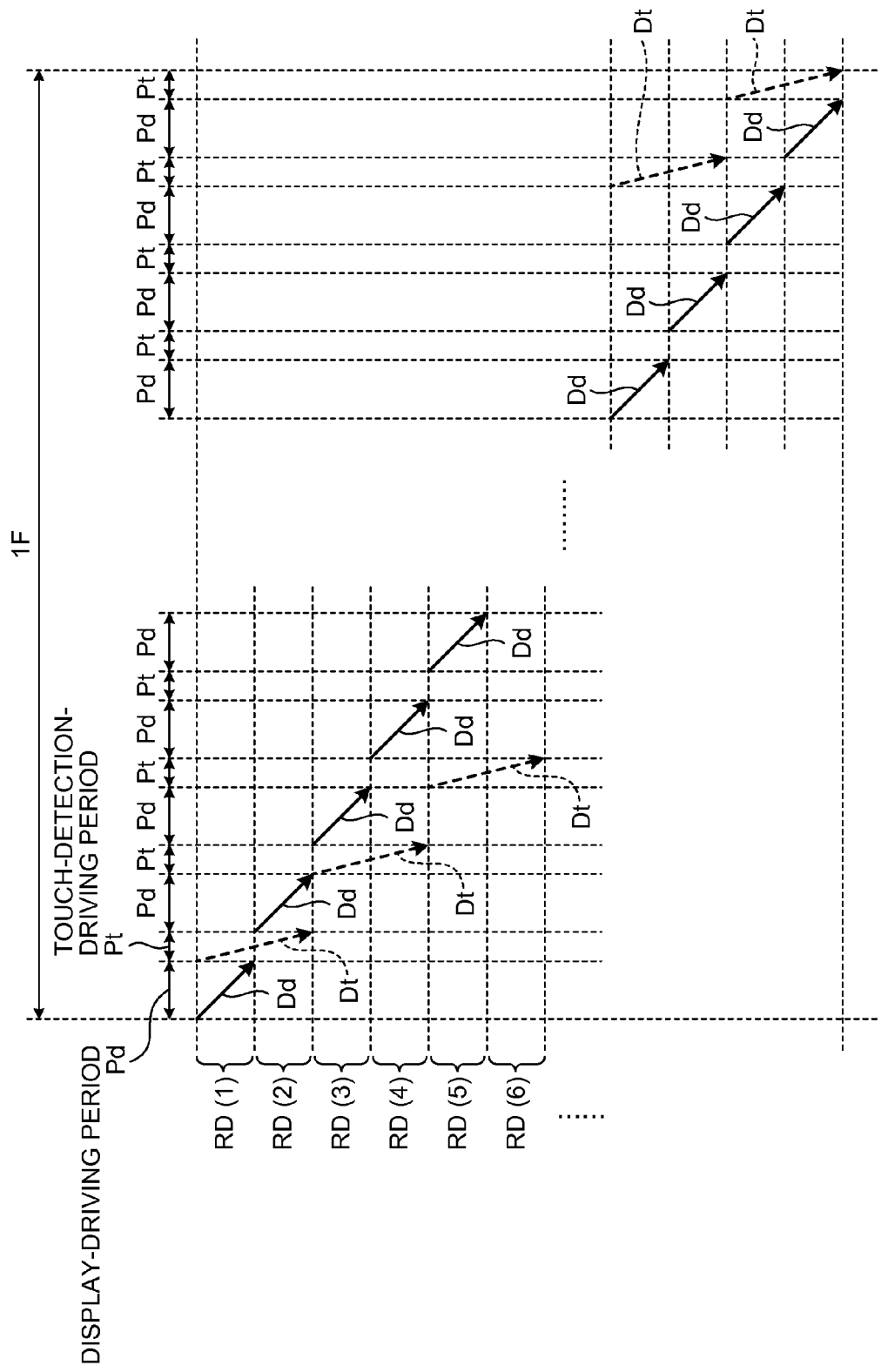
FIG. 12 is a block diagram illustrating an example of operations of the display device illustrated in FIG. 4.

FIG. 12 schematically illustrates an example of operations of the display device 1 in a frame period (1F). The horizontal axis in FIG. 12 represents time and the vertical axis represents a position on the display screen in the vertical direction (the scanning direction). Vertical blanking periods are omitted in FIG. 12.

A frame period (1F) alternately includes two periods: a display-driving period Pd in which driving for display Dd is performed; and a touch-detection-driving period Pt in which driving for touch detection Dt is performed. In this example, the driving for touch detection Dt is performed at the doubled scanning speed of the driving for display Dd. That is, the touch detection operation on the whole touch detection surface is operated twice during a frame period (1F).

In the initial display-driving period Pd, the gate driver 12 and the source driver 13 drive a partial display area RD(1) by sequentially scanning the lines, i.e., through the line-sequential scanning (the driving for display Dd).

In the subsequent touch-detection-driving period Pt, the drive electrode driver 14 sequentially selects the drive electrodes COML targeted for driving for touch detection and supplies the AC drive signal VcomAC to the selected drive electrodes COML (the driving for touch detection Dt). The touch detection unit 18 detects an external approaching object based on the touch detection signal Vdet output from the touch sensor unit 17 according to the AC drive signal VcomAC.

In the same manner, the gate driver 12 and the source driver 13 perform the driving for display Dd on a partial display area RD(2) in the subsequent display-driving period Pd. The drive electrode driver 14 performs the driving for display Dd in the subsequent touch-detection-driving period Pt.

As described above, the display device 1 alternately performs the driving for display Dd or the driving for touch detection Dt in a frame period (1F), thereby performing the display operation on the display surface overall and also performing the touch detection operation on the touch detection surface overall. Accordingly, the driving for display Dd and the driving for touch detection Dt are each performed in individual periods in the display device 1, whereby the influence of the driving for display Dd on the touch detection operation can be reduced, for example.

The following describes in detail the display operation in the display-driving period Pd and the touch detection operation in the touch-detection-driving period Pt.

Figure 13:
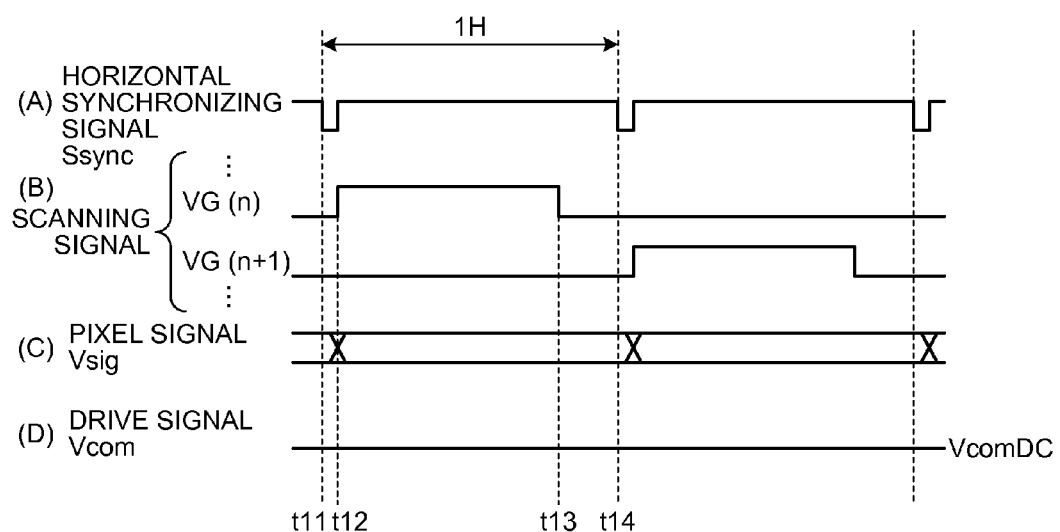
FIG. 13 is a timing waveform diagram illustrating an example of display operations of the display device illustrated in FIG. 4.

FIG. 13 illustrates a timing diagram of the display operation. (A) represents the waveform of a horizontal synchronizing signal Ssync, (B) represents the waveform of the scanning signal VG, (C) represents the waveform of the pixel signal Vsig, and (D) represents the waveform of the drive signal Vcom.

In the display device 1, during the display-driving period Pd, the drive electrode driver 14 applies the DC drive signal VcomDC to all of the drive electrodes COML ((D) in FIG. 13) and the gate driver 12 sequentially applies the scanning signals VG to the scanning signal lines GCL for each horizontal period (1H), whereby display scanning is achieved. The following describes the details.

Firstly, at the timing t11, a pulse is generated in a horizontal synchronizing signal Ssync, and a horizontal period (1H) starts.

At the timing t12, the gate driver 12 applies the scanning signal VG(n) to the scanning signal line GCL(n) on the n-th row relating to the display operation, whereby the level of the scanning signal VG(n) changes from low to high ((B) in FIG. 13). This enables the gate driver 12 to select a horizontal line targeted for driving for display.

At the same time, the source driver 13 applies the pixel signal Vsig to the pixel signal line SGL ((C) in FIG. 13). This applies the pixel signals Vsig to the subpixels SPix included in the horizontal line that has been selected as a target for driving for display.

At the timing t13, the gate driver 12 changes the level of the scanning signal VG(n) of the scanning signal line GCL on the n-th row from high to low ((B) in FIG. 13). This electrically disconnects the subpixels SPix on a horizontal line relating to the display operation from the pixel signal line SGL.

At the timing t14, a horizontal period (1H) ends and a new horizontal period (1H) starts. Driving for display starts for the next row ((n+1)th row) on the new horizontal period (1H).

Repeating the above-described operations achieves the display operation of the display device 1 in the partial display area RD through the line-sequential scanning in each display-driving period Pd.

Figure 14:
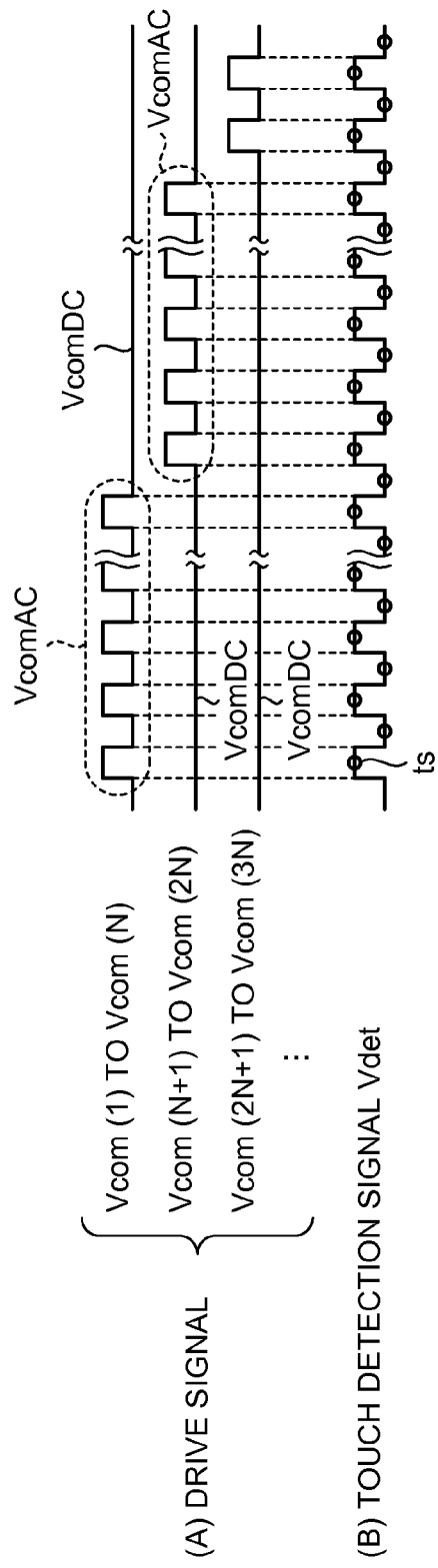
FIG. 14 is a timing waveform diagram illustrating an example of touch detection operations of the display device illustrated in FIG. 4.

FIG. 14 is a timing diagram illustrating a touch detection operation. (A) represents the waveform of the drive signal Vcom and (B) represents the waveform of the touch detection signal Vdet.

The drive electrode driver 14 sequentially selects a plurality of (in this example, the number N of) drive electrodes COML targeted for driving for touch detection in the touch-detection-driving period Pt and supplies the AC drive signal VcomAC to the selected drive electrodes COML. The AC drive signal VcomAC is transmitted through the electrostatic capacitance to the touch detection electrode TDL, whereby the touch detection signal Vdet changes ((B) in FIG. 14). The touch detection unit 18 performs A/D conversion on the touch detection signal Vdet at the sampling timing is in synchronization with each pulse of the AC drive signal VcomAC ((B) in FIG. 14), whereby the touch detection operation is achieved.

Detailed Operations of Gate Driver 12

Figure 15:
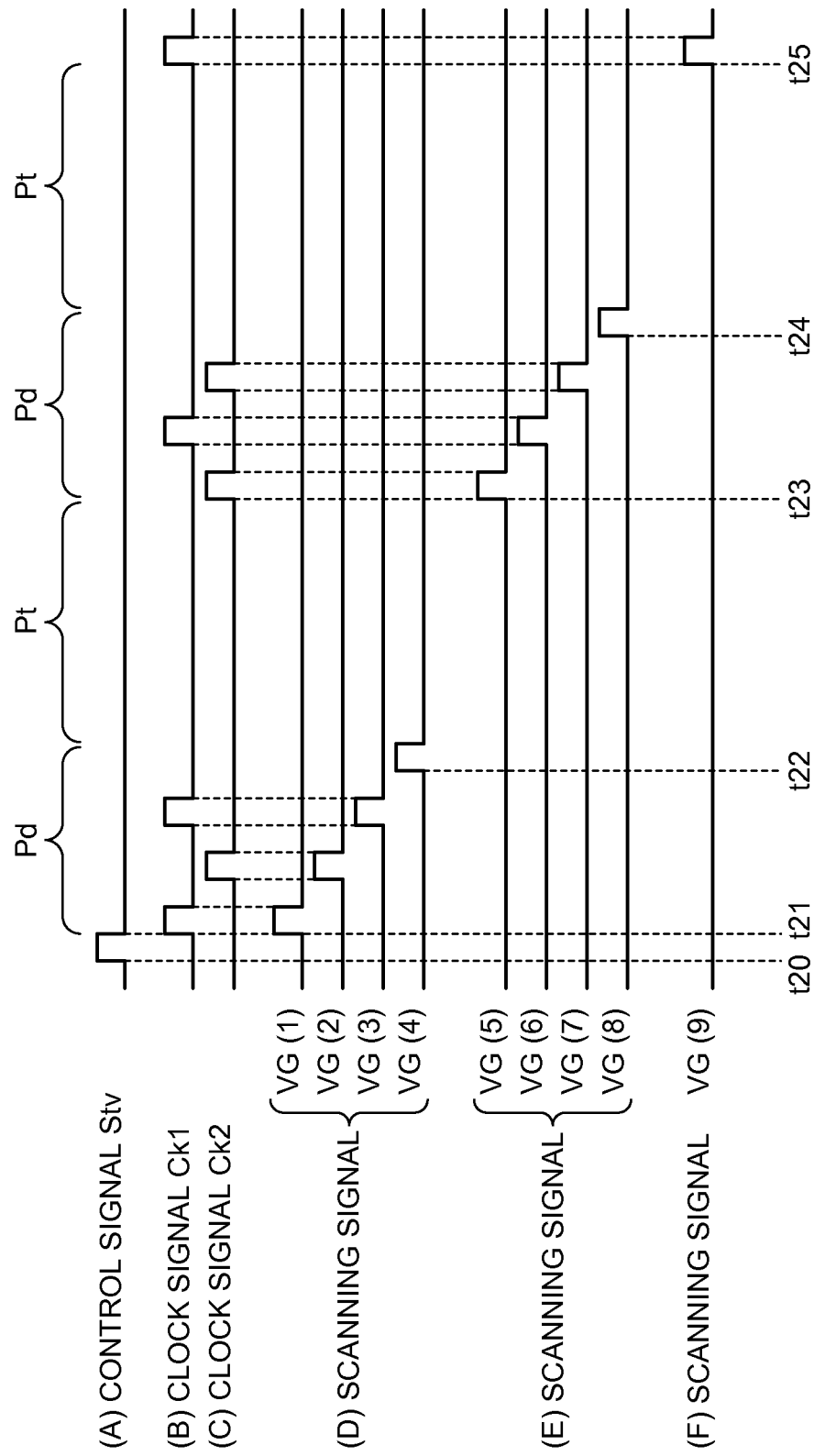
FIG. 15 is a timing waveform diagram illustrating an example of operations of the shift register illustrated in FIG. 8.

FIG. 15 illustrates an example of operations of the gate driver 12. (A) represents the waveform of the control signals Stv, (B) represents the waveform of the clock signal Ck1, (C) represents the waveform of the clock signal Ck2, (D) represents the waveform of the scanning signals VG(1) to VG(4), (E) represents the waveform of the scanning signals VG(5) to VG(8), and (F) represents the waveform of the scanning signal VG(9).

The gate driver 12 sequentially generates the scanning signals VG in the display-driving period Pd and supplies the signals to the liquid crystal display unit 16. In the touch-detection-driving period Pt, the gate driver 12 stops generating the scanning signal VG. The gate driver 12 controls the generation of the scanning signal VG by the clock signals Ck1 and Ck2 as follows.

Firstly, the scanning control unit 51 generates the control signal Stv that rises at the timing t20 and falls at the timing t21 ((A) in FIG. 15). The uppermost transfer circuit 50(1) of the shift register 52 forwards the control signal Stv in synchronization with the clock signal Ck1 ((B) in FIG. 15), thereby generating the scanning signal VG(1) ((D) in FIG. 15). The transfer circuit 50(2) forwards the scanning signal VG(1) in synchronization with the clock signal Ck2 ((C) in FIG. 15), thereby generating the scanning signal VG(2) ((D) in FIG. 15). In the same manner, the transfer circuit 50(3) forwards the input signal for generating the scanning signal VG(3), and the transfer circuit 50(4) forwards the input signal for generating the scanning signal VG(4) ((D) in FIG. 15). As described above, the transfer circuits 50(1) to 50(4) generate the scanning signals VG(1) to VG(4) in the display-driving period Pd and supply the signals to the liquid crystal display unit 16, respectively.

The scanning control unit 51 stops generating the clock signals Ck1 and Ck2 at the timing t22, and then restarts the generation at the timing t23 ((B) and (C) in FIG. 15). The subsequent transfer circuits 50(5) to 50(8) forward the input signals in synchronization with the pulse of the clock signals Ck1 and Ck2 that continuously appear at the timing t23 and later ((E) in FIG. 15). That is, in the touch-detection-driving period Pt, the scanning control unit 51 stops generating the clock signals Ck1 and Ck2 and then restarts the generation to generate the first pulse. The scanning control unit 51 continues generating the clock signals Ck1 and Ck2 in the subsequent display-driving period Pd. The transfer circuits 50(5) to 50(8) generate the scanning signals VG(5) to VG(8) and supply the signals to the liquid crystal display unit 16, respectively.

The scanning control unit 51 stops generating the clock signals Ck1 and Ck2 at the timing t24 and then restarts the generation at the timing t25 ((B) and (C) in FIG. 15).

As described above, the gate driver 12 temporarily stops generating the clock signals Ck1 and Ck2 in the touch-detection-driving period Pt, thereby stopping the generation of the scanning signal VG.

2-3. Advantages

As described above, in the present embodiment, setting the voltage of the wiring serving as a leak path to the potential H, by inputting the holding potential signal during the period when the operation of the circuit is stopped prevents the charged potential H from decreasing. This can suppress a decrease in display quality.

2-4. Modification 1

As described above, in the display device 1 in this example, the holding potential signal is input to a transfer circuit disposed in a stage where the shift signal can be stored in the discontinued period included in transfer circuits configured in a plurality of stages provided in the shift register 52. Accordingly, the holding potential signals are input to the transfer circuits configured in a plurality of stages for every predetermined number of stages (the number of circuits), for example. In the above-described example, the holding potential signals are input for every four stages (for every four circuits). This is provided merely for exemplary purpose and not for limitation. For example, the holding potential signal may be input for any number of stages (circuits), i.e., smaller or less than four.

2-5. Modification 2

Figure 16:
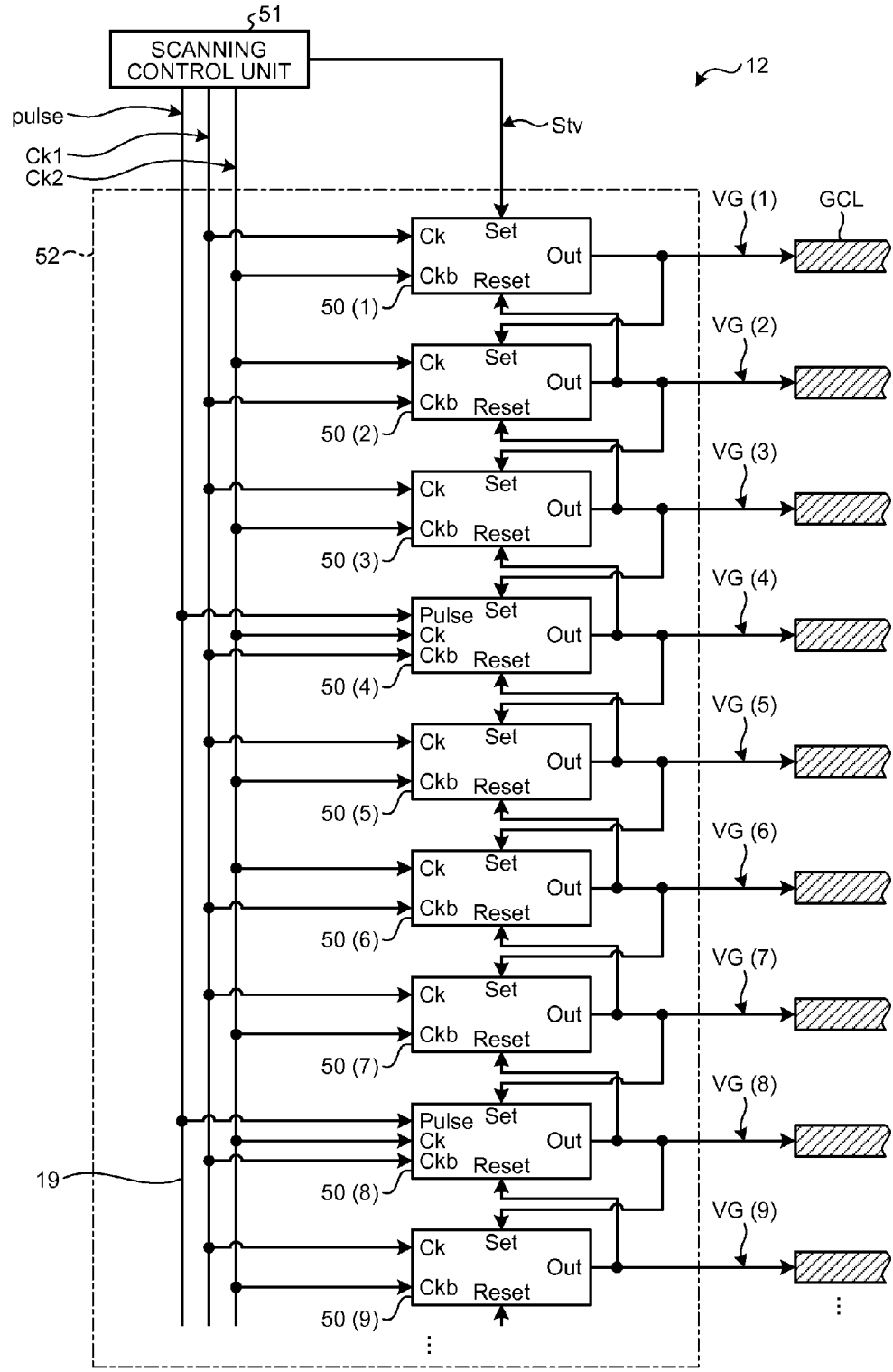
FIG. 16 is a block diagram illustrating a modification of the gate driver according to the embodiment.

FIG. 8 illustrates an example in which the holding potential signal line 19 is individually provided for each transfer circuit that can store the shift signal in the discontinued period (the transfer circuit with the configuration illustrated in FIG. 10). This configuration of the shift register is provided merely for exemplary purpose and not for limitation. For example, as illustrated in FIG. 16, all of the transfer circuits with the configuration illustrated in FIG. 10 may share a holding potential signal line 19. In other words, in the shift register, the holding potential signal pulse may be input to all of the transfer circuits with the configuration illustrated in FIG. 10 in the discontinued period.

Figure 17:
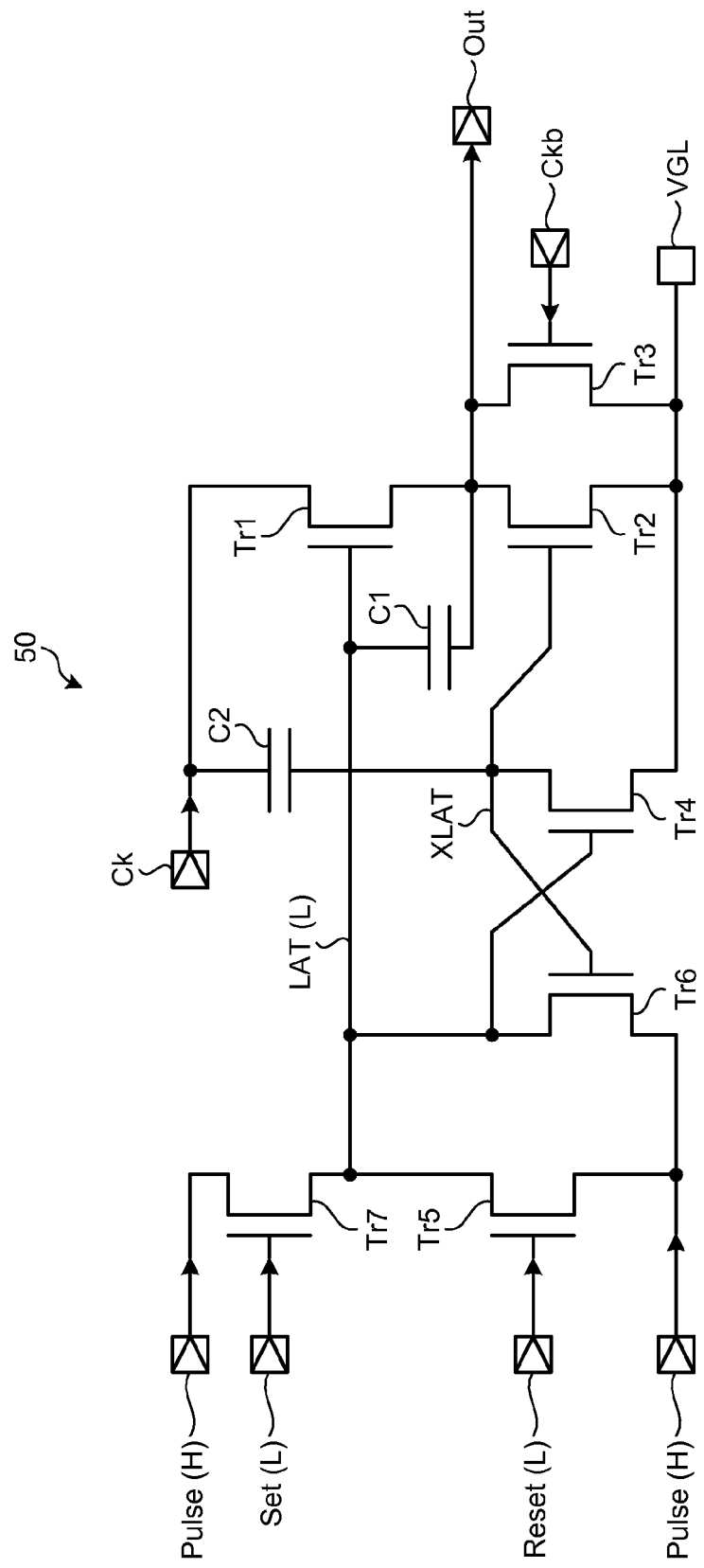
FIG. 17 is a diagram for explaining operations of a transfer circuit to which a holding potential signal is input in the gate driver illustrated in FIG. 16.

If the holding potential signal pulse is input to all of the transfer circuits with the configuration illustrated in FIG. 10 in the discontinued period, the holding potential signal pulse to the input terminal Pulse has the potential H and the node LAT has the potential L except for the transfer circuit currently outputting the scanning signal as illustrated in FIG. 17. The Set terminal and the Reset terminal have the potential L. As illustrated in FIG. 17, if the holding potential signal pulse has the potential H (represented with H in FIG. 17), an off-leak current can increase the voltage of the node LAT.

With this configuration, however, the time period in which the node LAT decreases due to the off-leak current from the potential H to the potential L can be longer than the configuration of the shift register adopting only the transfer circuit with the configuration illustrated in FIG. 9, for example. This extends the margins for the operations.

Figure 18:
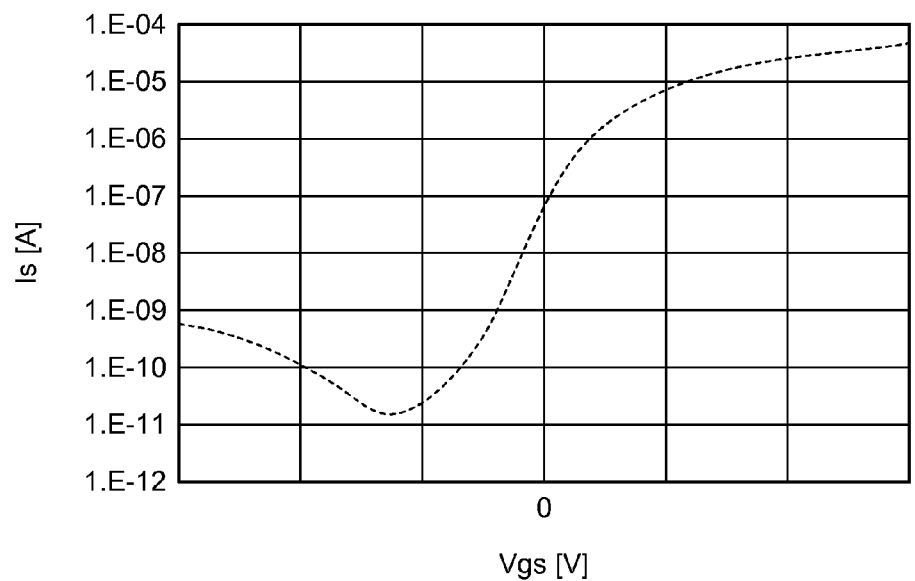
FIG. 18 is a diagram for illustrating an example of the operation characteristics of a thin film transistor (TFT) when irradiated with light according to the embodiment.

FIG. 18 illustrates an example of the characteristics of a thin film transistor (TFT) when irradiated with light. In FIG. 18, the horizontal axis represents the gate-source voltage Vgs [V] and the vertical axis represents the source current IS [A], which are obtained by measuring the actual TFT included in the circuit. For the measurement, the backlight of the display unit is set to 7000 candela/m$^2$, and a source voltage VS of 5.1 [V] is applied to the TFT with the surface of the TFT blocked from the light.

In FIG. 18, change of the gate-source voltage Vgs rapidly changes the source current IS in the vicinity of a gate-source voltage Vgs of 0 [V].

If the node LAT in the transfer circuit illustrated in FIG. 9 decreases from the potential H to the potential L due to a current leak, the gate-source voltages Vgs of the transistors Tr5, Tr6, and Tr7 coupled to the node LAT are 0 [V] regardless of the potential of the node LAT. Accordingly, if a current leaks, the point of operation has the gate-source voltage Vgs of 0 [V] illustrated in FIG. 18, which generates a large amount of current leak.

In the transfer circuit illustrated in FIG. 10, initially the gate-source voltage Vgs is 0 [V]. After that, if the voltage value of the node LAT increases, the gate-source voltage Vgs decreases to below 0 [V] and the amount of current leak of the transistors Tr5, Tr6, and Tr7 significantly reduces. With the configuration of the transfer circuit illustrated in FIG. 10, the discontinued period of the clock signal can be set longer than the transfer circuit illustrated in FIG. 9.

In a simulation by the inventors of the present disclosure, if the voltage value of the node LAT increases, the gate voltage is maintained at the potential L until the voltage value of the node LAT reaches 3 [V]. With reference to the waveform illustrated in FIG. 18, a leak current of 8E-8 [A] flows if the gate-source voltage Vgs is 0 [V]. In the transfer circuit illustrated in FIG. 9, if the voltage fluctuation of the node LAT is maintained equal to or smaller than 2 [V], the stop time t is represented by the following expression (1):

$$t=4 \text{ [pF]}*2 \text{ [V]}/8E\text{-}8 \text{ [A]}=100 \text{ [μs]} \qquad (1)$$

where 4 [pF] represents an example of the capacitance of the node LAT.

In the transfer circuit illustrated in FIG. 10, if the leak current is determined as 2E-8 [A] because the point of operation may be slightly closer to the minus, the stop time t is represented by the following expression (2):

$$t=4 \text{ [pF]}*2 \text{ [V]}/2E\text{-}8 \text{ [A]}=400 \text{ [μs]} \qquad (2)$$

where 4 [pF] represents an example of the capacitance of the node LAT.

Accordingly, the structure illustrated in FIG. 10 can make the discontinued period of the clock longer than the structure illustrated in FIG. 9.

2-6. Modification 3

Applying a positive (+) voltage shifts a threshold voltage Vth of a transistor made of amorphous silicon (a-Si) to the positive direction, and applying a negative (−) voltage shifts the threshold voltage Vth of a transistor made of amorphous silicon (a-Si) to the negative direction. Shifting of the threshold voltage Vth to the negative direction may generate a depletion transistor.

Figure 19:
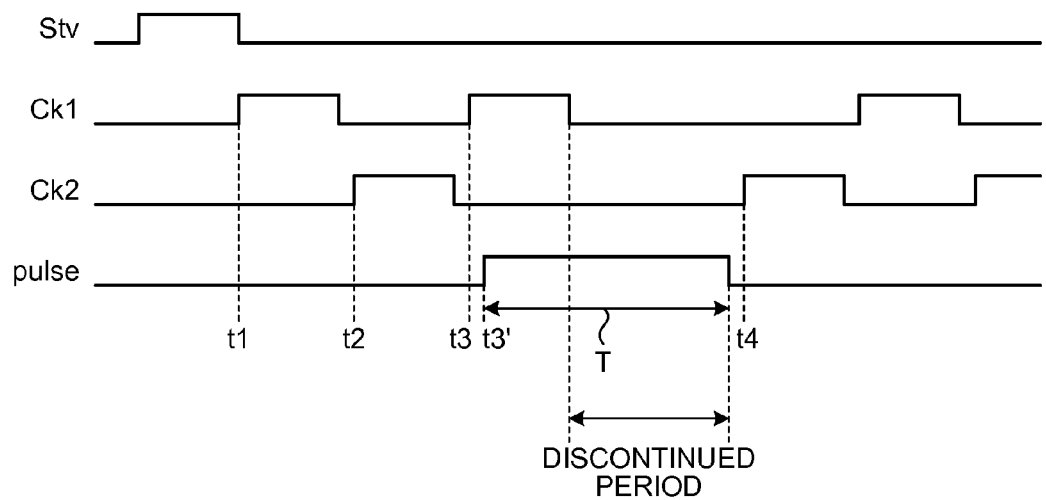
FIG. 19 is a timing waveform diagram illustrating a modification of operations of the shift register according to the embodiment.

The gate of the above-described transistor Tr7 has a timing for shifting to the negative direction but has no timing for shifting to the positive direction with respect to the channel, thereby becoming a depletion transistor. To avoid this, with reference to the timing diagram in FIG. 11, the rising timing of the holding potential signal pulse is slightly later than the rising timing of the clock signal Ck1. Specifically, as illustrated in FIG. 19, the rising timing t3' of the holding potential signal pulse is slightly later than the rising timing t3 of the clock signal Ck1. This generates timing for the gate of the transistor Tr7 to have the potential H and the channel to have the potential L, thereby suppressing the shift of threshold of the voltage Vth to the negative direction.

3. Application Examples

The following describes examples to which the display device according to the above-described embodiment or modifications is applied. FIGS. 20 to 32 are diagrams each illustrating an example of the external appearance of the electronic apparatus to which the display device according to the present embodiment or the modifications is applied. The display device according to the present embodiment or the modifications can be applied to electronic apparatuses in various fields, such as television devices, digital cameras, notebook personal computers, mobile terminal devices, e.g., mobile phones, and video cameras. In other words, the display device according to the present embodiment or the modifications can be applied to electronic apparatuses in various fields that display externally received video signals or internally generated video signals as images or video pictures.

3-1. Application Example 1

Figure 20:
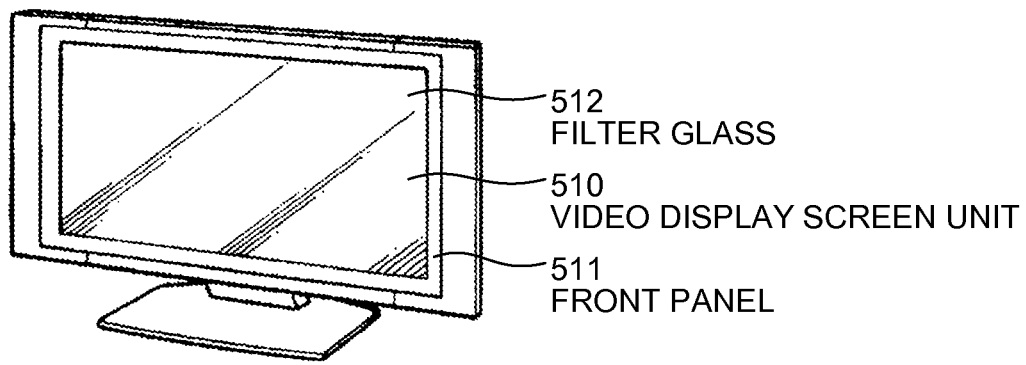
FIG. 20 is a diagram illustrating an example of the external appearance of an electronic apparatus to which the display device according to the embodiment or the modifications is applied.

The electronic apparatus illustrated in FIG. 20 is a television device to which the display device according to the present embodiment or the modifications is applied. This television device includes, for example, a video display screen unit 510 that includes a front panel 511 and a filter glass 512. The video display screen unit 510 serves as the display device according to the present embodiment or the modifications.

3-2. Application Example 2

Figure 21:
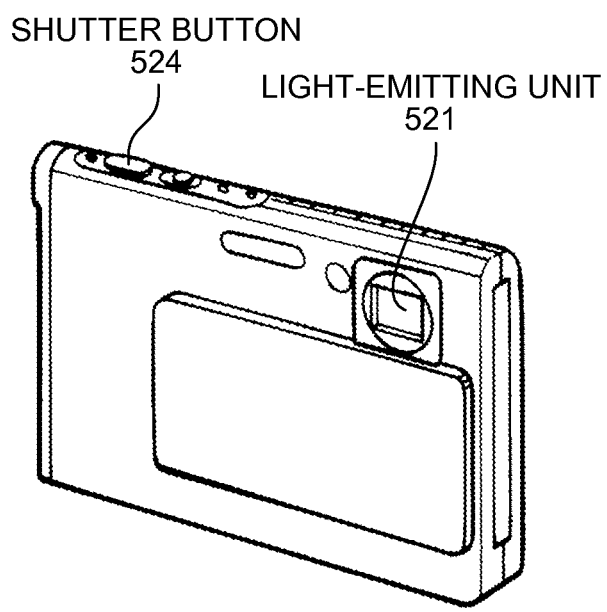
FIG. 21 is a diagram illustrating an example of the external appearance of an electronic apparatus to which the display device according to the embodiment or the modifications is applied.
Figure 22:
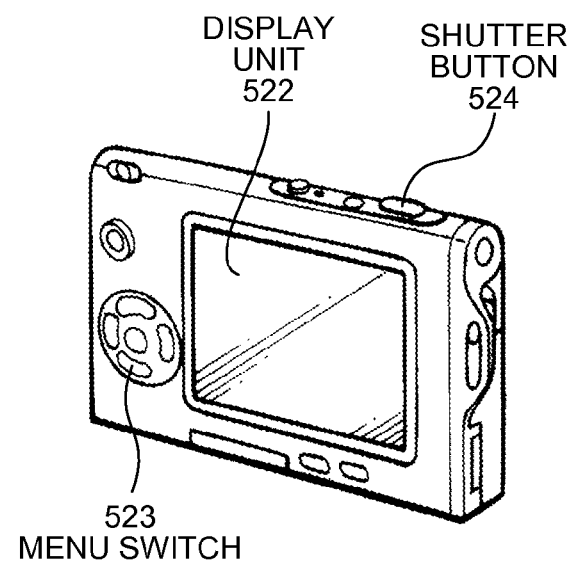
FIG. 22 is a diagram illustrating an example of the external appearance of an electronic apparatus to which the display device according to the embodiment or the modifications is applied.

The electronic apparatus illustrated in FIGS. 21 and 22 is a digital camera to which the display device according to the present embodiment or the modifications is applied. This digital camera includes, for example, a light-emitting unit 521 for flash, a display unit 522, a menu switch 523, and a shutter button 524. The display unit 522 serves as the display device according to the present embodiment or the modifications.

3-3. Application Example 3

Figure 23:
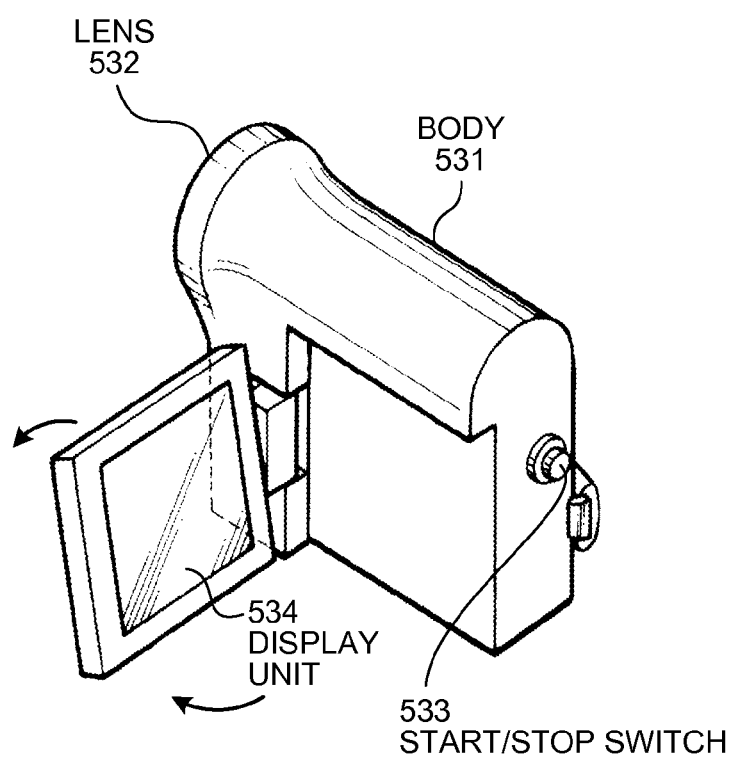
FIG. 23 is a diagram illustrating an example of the external appearance of an electronic apparatus to which the display device according to the embodiment or the modifications is applied.

The electronic apparatus illustrated in FIG. 23 represents an external appearance of a video camera to which the display device according to the present embodiment or the modifications is applied. This video camera includes, for example, a body 531, a lens 532 for capturing a subject provided on the front side face of the body 531, and a start/stop switch 533 and a display unit 534 that are used during shooting. The display unit 534 serves as the display device according to the present embodiment or the modifications.

3-4. Application Example 4

Figure 24:
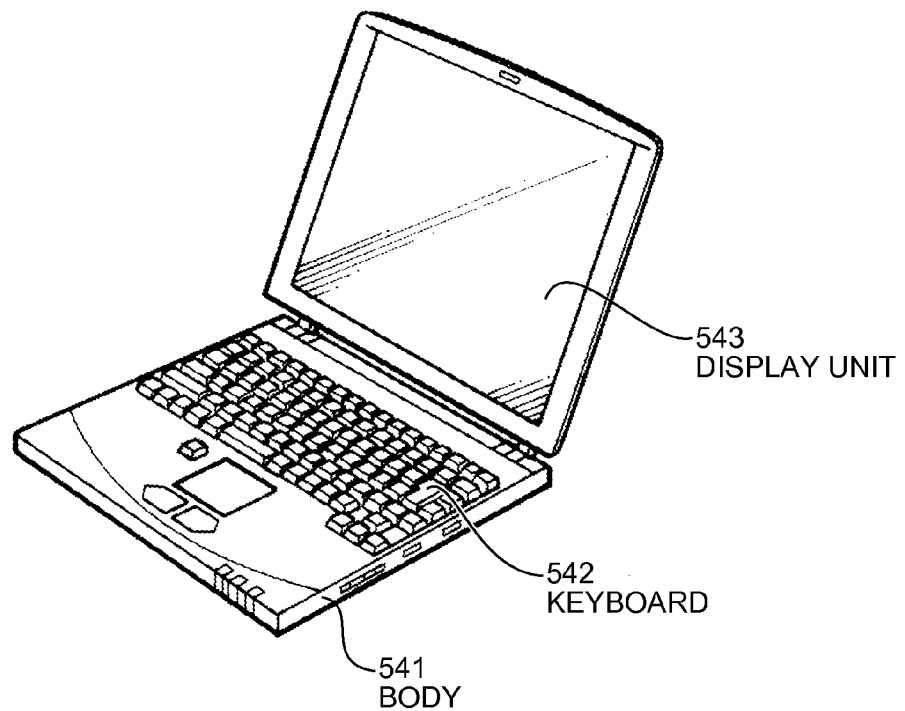
FIG. 24 is a diagram illustrating an example of the external appearance of an electronic apparatus to which the display device according to the embodiment or the modifications is applied.
Figure 25:
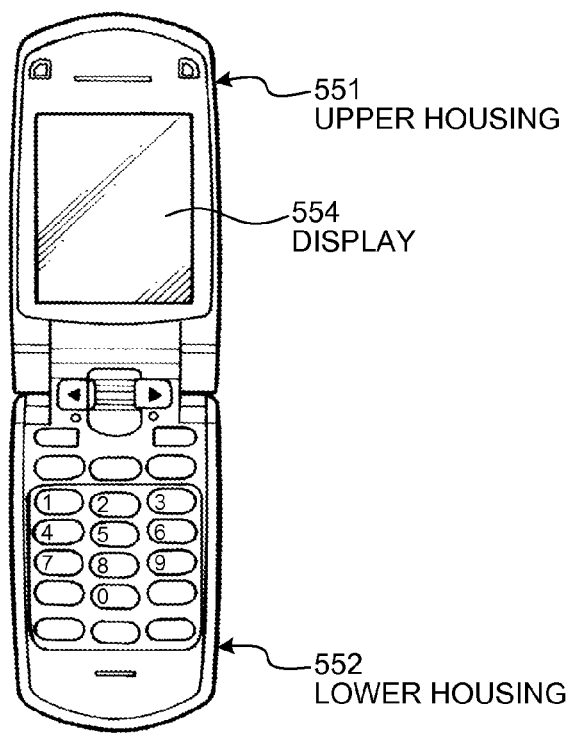
FIG. 25 is a diagram illustrating an example of the external appearance of an electronic apparatus to which the display device according to the embodiment or the modifications is applied.
Figure 26:
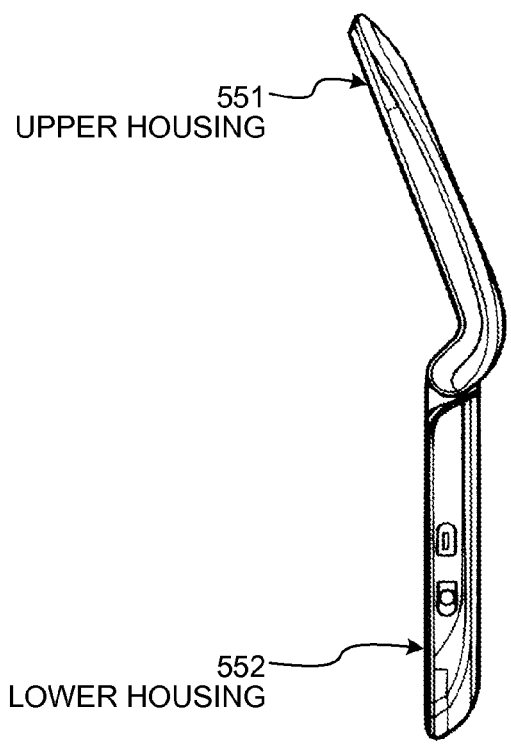
FIG. 26 is a diagram illustrating an example of the external appearance of an electronic apparatus to which the display device according to the embodiment or the modifications is applied.
Figure 27:
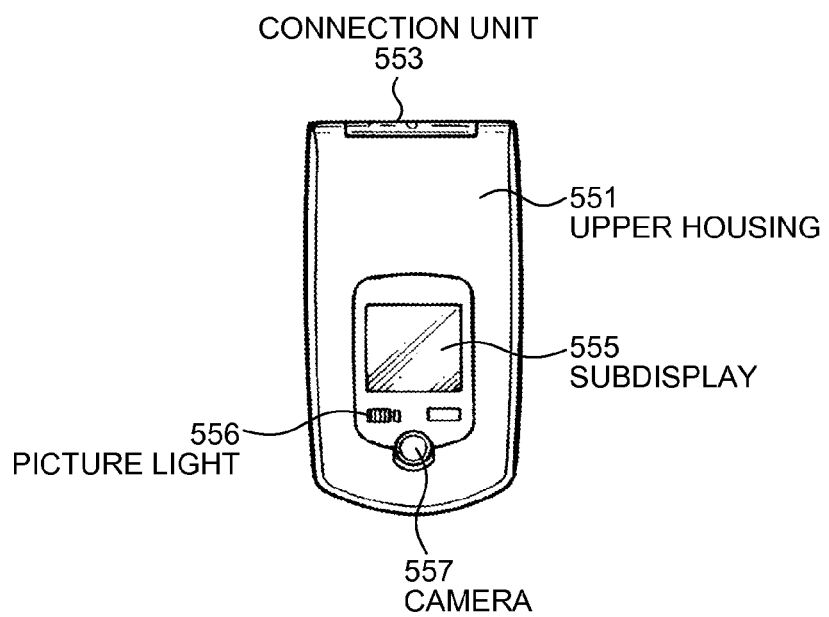
FIG. 27 is a diagram illustrating an example of the external appearance of an electronic apparatus to which the display device according to the embodiment or the modifications is applied.
Figure 28:
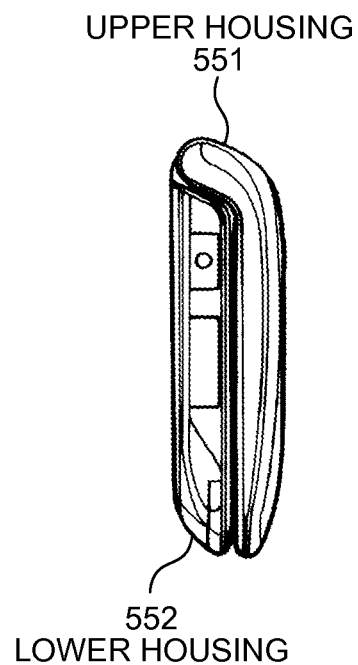
FIG. 28 is a diagram illustrating an example of the external appearance of an electronic apparatus to which the display device according to the embodiment or the modifications is applied.
Figure 29:
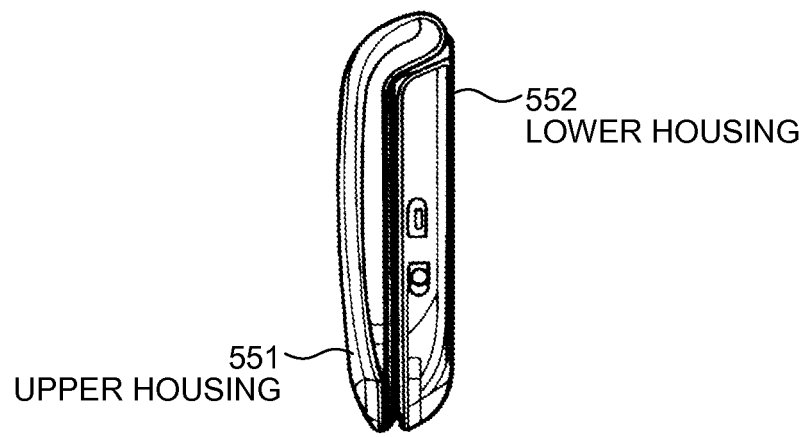
FIG. 29 is a diagram illustrating an example of the external appearance of an electronic apparatus to which the display device according to the embodiment or the modifications is applied.
Figure 30:
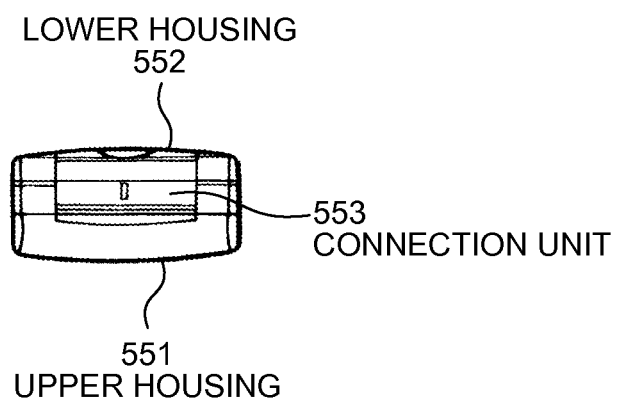
FIG. 30 is a diagram illustrating an example of the external appearance of an electronic apparatus to which the display device according to the embodiment or the modifications is applied.
Figure 31:
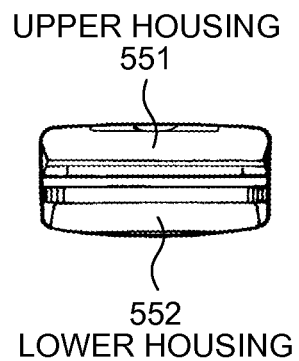
FIG. 31 is a diagram illustrating an example of the external appearance of an electronic apparatus to which the display device according to the embodiment or the modifications is applied.

The electronic apparatus illustrated in FIG. 24 is a notebook personal computer to which the display device according to the present embodiment or the modifications is applied. This notebook personal computer includes, for example, a body 541, a keyboard 542 for input operation of characters, etc., and a display unit 543 that displays images. The display unit 543 serves as the display device according to the present embodiment or the modifications.

3-5. Application Example 5

The electronic apparatus illustrated in FIGS. 25 to 31 is a mobile phone to which the display device according to the present embodiment or the modifications is applied. This mobile phone includes, for example, an upper housing 551 and a lower housing 552 connected to each other with a connection unit (hinge unit) 553, and includes a display 554, a subdisplay 555, a picture light 556, and a camera 557. The display 554 and/or the subdisplay 555 serve as the display device according to the present embodiment or the modifications.

3-6. Application Example 6

Figure 32:
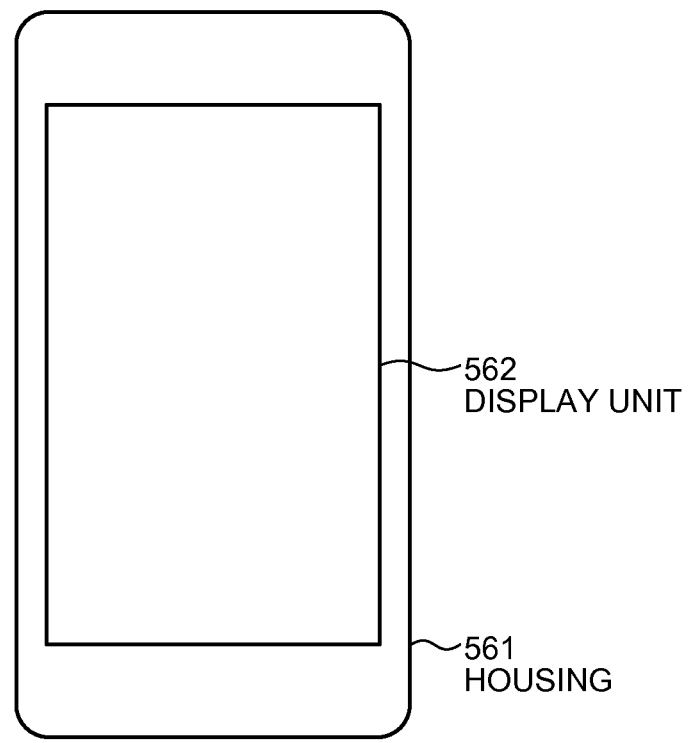
FIG. 32 is a diagram illustrating an example of the external appearance of an electronic apparatus to which the display device according to the embodiment or the modifications is applied.

The electronic apparatus illustrated in FIG. 32 is a portable information terminal that operates as a mobile computer, a multi-function mobile telephone, a mobile computer with a voice call function, or a mobile computer with a communication function, which is also called a smart phone or a tablet terminal. The portable information terminal has a display unit 562 on the surface of a housing 561, for example. The display unit 562 serves as a display device according to the embodiment or the modifications.

While the present disclosure has been described using a certain embodiment and application examples to electronic apparatuses, these embodiment and application examples have been presented by way of example only, and are not intended to limit the scope of the disclosure. Indeed, the present disclosure may be embodied in a variety of modifications.

In the above-described embodiment and examples, the touch sensor unit 17 is integrated with the liquid crystal display unit 16 adopting a horizontal electric field mode liquid crystal such as a fringe-field switching (FFS) liquid crystal and an in-plane switching (IPS) liquid crystal. Alternatively the touch sensor unit 17 may be integrated with various modes of liquid crystals such as a twisted nematic (TN) mode liquid crystal, a vertical alignment (VA) mode liquid crystal, and an electrically controlled birefringence (ECB) mode liquid crystal. If such a liquid crystal is used, the display unit with a touch sensor may be achieved with the structure illustrated in FIG. 33. FIG. 33 illustrates an example of the sectional structure of the relevant part of the display unit with a touch sensor 15B according to the present modification. FIG. 33 illustrates a state in which a liquid crystal layer 9B is sandwiched between a pixel substrate 20B and a counter substrate 30B. Descriptions of the names and functions of other parts common to the structure illustrated in FIG. 5 are omitted. In this example, unlike the structure illustrated in FIG. 5, the drive electrode COML commonly used for display and touch detection is provided on the counter substrate 30B.

In the embodiment and examples, an electrostatic capacitance touch sensor is used, however, this is provided merely for exemplary purpose and not for limitation. For example, an optical-based touch sensor or a resistance-based touch sensor may be used, alternatively.

In the embodiment and examples, liquid crystal elements are used for display elements, however, they are provided merely for exemplary purpose and not for limitation. For example, EL elements may be used, alternatively.

In the embodiment and examples, the liquid crystal display unit 16 and the touch sensor unit 17 are combined with each other and operate in different periods, i.e., in the display-driving period Pd and the touch-detection-driving period Pt, so as not to influence each other. However, this is provided merely for exemplary purpose and not for limitation. For example, the liquid crystal display unit 16 and a wireless communication unit may be combined with each other and operate in different periods, i.e., in the display-driving period Pd and a wireless communication period so that the display operation in the liquid crystal display unit 16 and the wireless communication operations in the wireless communication unit do not influence each other.

4. Aspects of Present Disclosure

The present Disclosure includes the following aspects:
(1) A display device comprising:
a display unit that has a plurality of scanning signal lines to which a scanning signal is applied;
a shift register that has a plurality of transfer circuits configured in a plurality of stages that perform a shift operation for temporarily storing a shift signal that has been input and sequentially transmitting the stored shift signal to a subsequent stage in synchronization with a clock signal having a discontinued period, and outputs the scanning signal to a scanning signal line corresponding to a transfer circuit that maintains the shift signal; and
a signal line that transmits a holding potential signal for maintaining a potential of the shift signal to a transfer circuit that maintains the shift signal in the discontinued period of the clock signal.
(2) The display device according to (1), wherein the transfer circuits configured in the plurality of stages include:
a first transfer circuit disposed in a stage where the shift signal is possibly maintained in the discontinued period; and
a second transfer circuit disposed in a stage where the shift signal is not maintained in the discontinued period.
(3) The display device according to (1), wherein
the transfer circuits include:
a latch part on which the potential is set by the shift signal output from a transfer circuit at a previous stage and the holding potential signal, and the set potential is cancelled by the shift signal output from a transfer circuit at a subsequent stage; and
a first switch part configured to be turned On by the potential maintained by the latch part and output the clock signal as the shift signal, and
the latch part maintains the potential of a current leak path by the holding potential signal in a period in which the holding potential signal is input.
(4) The display device according to (3), wherein
the transfer circuits include:
a second switch configured to be turned On by the shift signal output from a transfer circuit at a previous stage and set the potential on the latch part; and
a third switch configured to be turned On by a shift signal output from a transfer circuit at a subsequent stage and cancel the potential that has been set on the latch part, and
the latch part maintains the potential of a current leak path through the third switch by the holding potential signal in a period in which the potential is set by the holding potential signal through the second switch part.
(5) The display device according to (1), wherein the timing at which the holding potential signal rises is set later than the timing at which the clock signal rises.
(6) The display device according to (2), wherein
two or more first transfer circuits are used, and
the signal line is provided on each of the first transfer circuits.
(7) The display device according to (1), further comprising:
a touch sensor unit configured to detect a touch or approach on the display device, wherein
the discontinued period of the clock signal is set as a period for the touch sensor unit to detect a touch or approach on the display device.

(8) An electronic apparatus comprising:
the display device according to claim 1; and
a control device that supplies an input signal to the display device.

According to the present disclosure, a display device and an electronic apparatus can be provided that can suppress a decrease in display quality while intermittent line-sequential scanning is performed.

Specifically, a display device and an electronic apparatus according to the present disclosure achieves supplying holding potential signals to a transfer circuit through holding potential signal lines in a discontinued period of a clock signal so as to maintain the potential that has been set in the transfer circuit. This enables the display device and the electronic apparatus to suppress a decrease in display quality while intermittent line-sequential scanning is performed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:
1. A display device comprising:
a display unit that has a plurality of scanning signal lines to which a scanning signal is applied;
a holding potential signal line that is configured to transmit a holding potential signal for maintaining a potential of a shift signal that is sequentially supplied from a scanning control unit;
a shift register that is configured to have a plurality of transfer circuits in a plurality of stages perform a shift operation, the transfer circuits including
a first transfer circuit that is disposed in a stage in which the shift signal is maintained in a discontinued period of a clock signal and that is coupled with the holding potential signal line supplying the holding potential signal, the clock signal including a first clock signal and a second clock signal, and
a second transfer circuit disposed in a stage in which the shift signal is not maintained in the discontinued period of the clock signal and that is not coupled with the holding potential signal line,
wherein the first transfer circuit is configured to:
temporarily store the shift signal during the discontinued period which starts at a timing when the first clock signal falls after the holding potential signal rises, and which ends before the second clock signal rises, by maintaining the holding potential signal at a high level during a first period which starts at a timing when both the holding potential signal and the first clock signal rise, and which ends before the second clock signal rises;
sequentially transmit the stored shift signal to a subsequent stage in synchronization with the clock signal having the discontinued period; and
output the scanning signal to one of the scanning signal lines corresponding to the first transfer circuit upon the second clock signal rising,
wherein the second transfer circuit is configured to:
sequentially transmit the shift signal to a subsequent stage in synchronization with the clock signal having the discontinued period; and
output the scanning signal to one of the scanning signal lines corresponding to the second transfer circuit.

2. The display device according to claim 1, wherein
the first transfer circuit includes: a latch part and a first switch part,
a potential is set on the latch part by the shift signal output from the second transfer circuit in a previous stage and the holding potential signal,
the set potential is cancelled by the shift signal output from the second transfer circuit in a subsequent stage,
the first switch part is configured to be turned On by the potential maintained by the latch part and output the clock signal as the shift signal, and
the latch part maintains a potential of a current leak path by the holding potential signal in a period in which the holding potential signal is input.

3. The display device according to claim 2, wherein the first transfer circuit includes:
   a second switch that is coupled with the holding potential signal line; and
   a third switch,
the second switch is configured to be turned On by the shift signal output from the second transfer circuit in the previous stage and set the potential on the latch part,
the third switch configured to be turned On by the shift signal output from the second transfer circuit in the subsequent stage and cancel the potential that has been set on the latch part, and
the latch part maintains the potential of a current leak path through the third switch by the holding potential signal in a period in which the potential is set by the holding potential signal through the second switch.

4. The display device according to claim 3, wherein the latch part of the first transfer circuit includes
   a fourth switch that is coupled with the holding potential signal line, and
   a fifth switch.

5. The display device according to claim 1,
wherein the timing at which the holding potential signal rises is set later than the timing at which the clock signal rises.

6. The display device according to claim 1, wherein
two or more first transfer circuits are used, and
the potential holding signal line is provided on each of the first transfer circuits.

7. The display device according to claim 1, wherein
a touch sensor unit configured to detect a touch or approach on the display device,
the discontinued period of the clock signal is set as a period for the touch sensor unit to detect a touch or approach on the display device.

8. An electronic apparatus comprising:
the display device according to claim 1; and
a control device that supplies an input signal to the display device.

* * * * *